US006449761B1

(12) United States Patent
Greidinger et al.

(10) Patent No.: US 6,449,761 B1
(45) Date of Patent: Sep. 10, 2002

(54) METHOD AND APPARATUS FOR PROVIDING MULTIPLE ELECTRONIC DESIGN SOLUTIONS

(75) Inventors: Yaacov (Jacob) Greidinger; Ara Markosian, both of Cupertino; Jon Frankle, Los Gatos, all of CA (US)

(73) Assignee: Monterey Design Systems, Inc., Sunnyvale, CA (US)

( * ) Notice: Subject to any disclaimer, the term of this patent is extended or adjusted under 35 U.S.C. 154(b) by 0 days.

(21) Appl. No.: 09/227,491

(22) Filed: Jan. 7, 1999

Related U.S. Application Data

(60) Provisional application No. 60/090,298, filed on Jun. 23, 1998, provisional application No. 60/093,329, filed on Jul. 20, 1998, and provisional application No. 60/077,405, filed on Mar. 10, 1998.

(51) Int. Cl.[7] .............................................. G06F 17/50
(52) U.S. Cl. ................................ 716/11; 716/7; 716/10
(58) Field of Search ................................ 716/1, 2, 8, 9, 716/10, 11, 7

(56) References Cited

U.S. PATENT DOCUMENTS

| 4,823,276 A | | 4/1989 | Hiwatashi | 364/491 |
|---|---|---|---|---|
| 5,218,551 A | * | 6/1993 | Agrawal et al. | 364/491 |
| 5,237,514 A | * | 8/1993 | Curtin | 364/491 |
| 5,295,082 A | | 3/1994 | Chang et al. | 364/490 |
| 5,309,371 A | | 5/1994 | Shikata et al. | 364/491 |
| 5,381,343 A | | 1/1995 | Bamji et al. | 364/488 |
| 5,490,268 A | * | 2/1996 | Matsunaga | 395/550 |
| 5,493,510 A | | 2/1996 | Shikata | 364/491 |
| 5,526,517 A | | 6/1996 | Jones et al. | 395/600 |
| 5,535,134 A | | 7/1996 | Cohn et al. | 364/491 |
| 5,579,237 A | | 11/1996 | Shibuya | 364/491 |
| 5,581,474 A | | 12/1996 | Bamji et al. | 364/490 |
| 5,604,680 A | | 2/1997 | Bamji et al. | 364/491 |
| 5,636,129 A | | 6/1997 | Her | 364/488 |
| 5,726,903 A | * | 3/1998 | Kerzman et al. | 364/489 |

FOREIGN PATENT DOCUMENTS

WO  WO 98/00800  1/1998  ........... G06F/17/50

OTHER PUBLICATIONS

Koide, T. et al., "A Floorplanning Method With Topological Constraint Manipulation In VLSI Building Block Layout"IEICE Transaction on Fundamentals of Electronics, Communications and Computer Sciences; vol. E77–A, No. 12; Dec. 1994; pp. 2053–2057.

Okada, K. et al., "Compaction With Shape Optimization" Proceeding of the Custom Integrated Circuits Conference, San Diego; May 1–4 1994; pp. 545–548.

* cited by examiner

*Primary Examiner*—Matthew Smith
*Assistant Examiner*—Leigh Marie Garbowski
(74) *Attorney, Agent, or Firm*—Vierra Magen Marcus Harmon & DeNiro LLP

(57) ABSTRACT

An electronic computer aided design system provides for automated operation of a plurality of design tools to produce multiply design solutions to an initial circuit layout. Through the user entry of relative weights for: power, timing and area, different solutions to an initial layout can be generated exhibiting the requested balance of improvements over the original layout. A novel parts placement process is disclosed which prioritizes the reconfiguration of the initial design in a manner which assures that the multiple solutions will be generated which exhibit improved performance over the original layout in accordance with the priorities established by the user.

31 Claims, 21 Drawing Sheets

USER CONSTRAINTS

FIG. 7    SETTING TARGETS

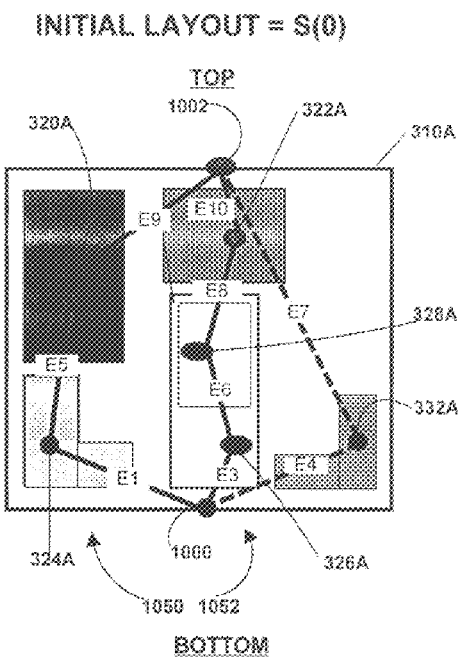
FIG. 10A
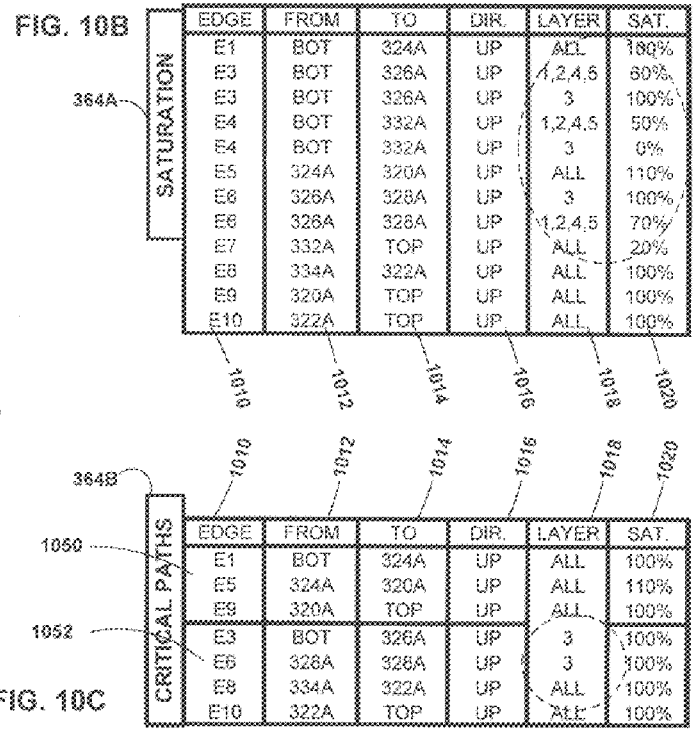
FIG. 10B
FIG. 10C

| | CUT | NODE | NODE | NODE | COST | | |
|---|---|---|---|---|---|---|---|
| | | | | | AREA | NET | TOTAL |
| CRITICAL CUTS | C1 | 320A | 322A | | 136 | | 136 |
| | C2 | 320A | 326-28A | | 191 | | 191 |
| | C3 | 324A | 322A | | 98 | | 98 |
| | C4 | 324A | 326-28A | | 163 | | 163 |
| | C5 | 320A | 322A | 326-28A | 255 | | 255 |
| | C6 | 320A | 322A | 324A | 170 | | 170 |
| | etc | | | | | | |

| | CUT | NODE | NODE | NODE | COST | | |
|---|---|---|---|---|---|---|---|
| | | | | | AREA | NET | TOTAL |
| ORDERED CRITICAL CUTS | C3 | 324A | 322A | | 98 | | 98 |
| | C1 | 320A | 322A | | 136 | | 136 |
| | C4 | 324A | 326-28A | | 163 | | 163 |
| | C6 | 320A | 322A | 324A | 170 | | 170 |
| | C2 | 320A | 326-28A | | 191 | | 191 |
| | C5 | 320A | 322A | 326-28A | 255 | | 255 |
| | etc. | | | | | | |

FIG. 12A1
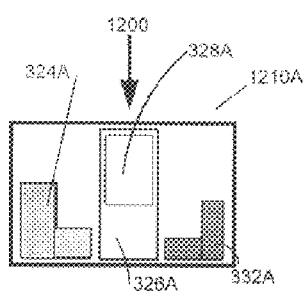
FIG. 12B1
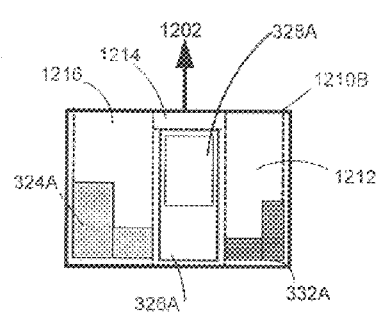
FIG. 12C1
SOLUTION: 1
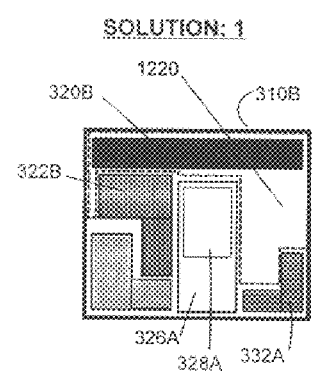
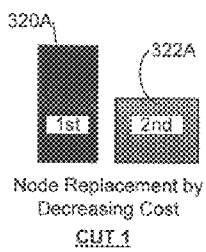
Node Replacement by
Decreasing Cost
CUT 1
FIG. 12A2
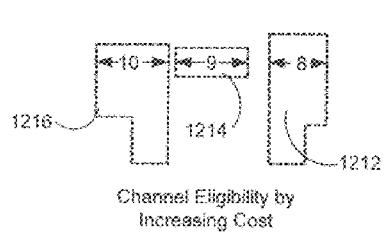
Channel Eligibility by
Increasing Cost
FIG. 12B2
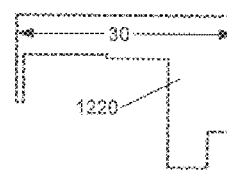
FIG. 12C2

FIG. 12D1
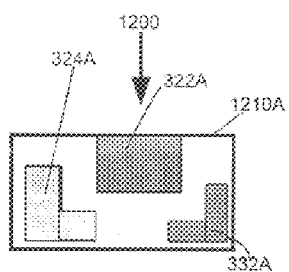
FIG. 12E1
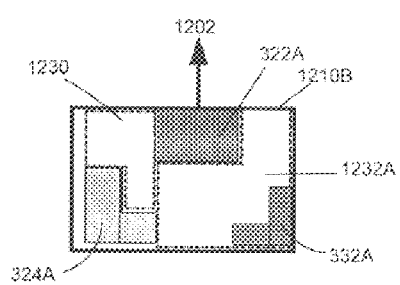
FIG. 12F1
SOLUTION: 2
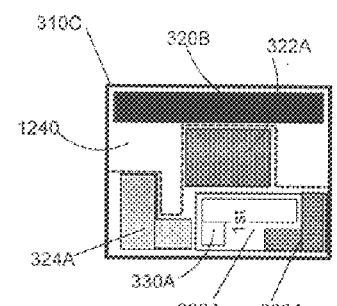
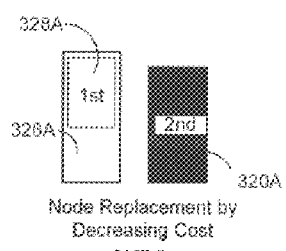
Node Replacement by
Decreasing Cost
CUT 2
FIG. 12D2
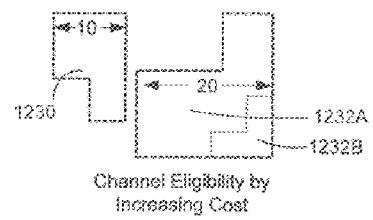
Channel Eligibility by
Increasing Cost
FIG. 12E2
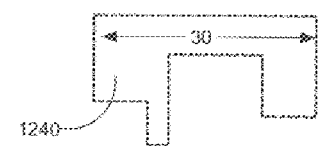
FIG. 12F2

FIG. 12G1
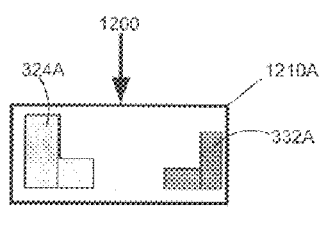
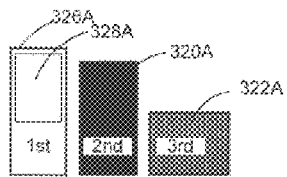
Node Replacement by
Decreasing Cost
CUT 5
FIG. 12G2
FIG. 12H1
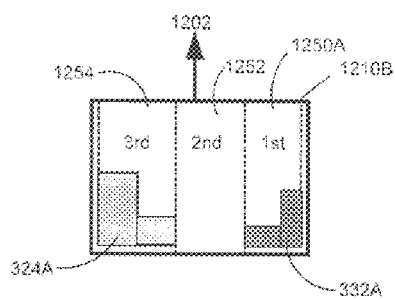
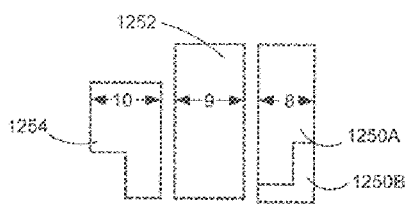
Channel Eligibility by
Increasing Cost
FIG. 12H2
FIG. 12I1
SOLUTION: 5
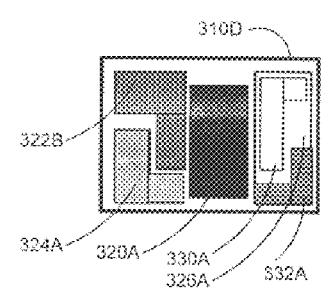

| SOLUTION (1510) | POWER (uA) (1512) | TIMING (Mhz) (1514) | AREA (U) (1516) | WEIGHTED TOTAL (1518) | CRITICAL PATH ? (1520) |
|---|---|---|---|---|---|
| S0 | | | | | NO (1550A) |

FIG. 15B

SOLUTION LIST

1500B

| SOLUTION (1510) | POWER (uA) (1512) | TIMING (Mhz) (1514) | AREA (U) (1516) | WEIGHTED TOTAL (1518) | CRITICAL PATH ? (1520) |
|---|---|---|---|---|---|
| S1 | 67 | 50 | 4400 | 1.11 | NO (1552A) |
| S5 | 70 | 47 | 4300 | 1.09 | NO |
| S3 | 79 | 48 | 4200 | 1.08 | NO |
| S2 | 69 | 45 | 4350 | 1.07 | NO |
| S0 | 75 | 43 | 4700 | 1.00 | YES (1550B) |
| S4 | 72 | 42 | 4800 | 0.99 | NO (1554A) |

METHOD AND APPARATUS FOR PROVIDING MULTIPLE ELECTRONIC DESIGN SOLUTIONS

CROSS REFERENCE TO RELATED APPLICATION

This application claims the benefit of prior filed copending Provisional Application No. 60/090,298, filed on Jun. 23, 1998, entitled Method And Apparatus For Compacting An Electronic Design, and claims the benefit of prior filed copending Provisional Application No. 60/093,329, filed on Jul. 20, 1998, entitled Method and Apparatus For Providing Multiple Electronic Design Solutions, and claims the benefit of prior filed copending Provisional Application No. 60/077, 405, filed on Mar. 10, 1998, entitled, EDA Compression And EDA Speculative Layout. Each of the above-cited applications is incorporated herein by reference in its entirety.

BACKGROUND OF THE INVENTION

1. Field of the Invention

The invention relates to computer-aided design systems, and in particular to computer aided electronic design systems which facilitate the design, simulation and layout of integrated circuit chips.

2. Related Art

Integrated circuit technology has provided a basis for the design of increasingly miniaturized systems, often providing capabilities impossible orimpractical on a larger scale. As technology has progressed, the need for greater density of integrated circuit technology. As the geometries of integrated circuit devices shrink and the capability to provide more function on a single integrated circuit grows, the need arises to provide designers with tools to facilitate the design of more complicated integrated circuit chips. This capability is provided by computer aided design systems.

Integrated circuits are often designed by the designer in a modular fashion. The designer breaks up the design into small, manageable pieces and captures each such piece as a module. A completed design may comprise many such modules, and modules may further comprise other modules, etc. This "nested" modular approach is particularly useful when a design is highly repetitive, since a relatively simple module may be designed and debugged, then replicated many times. This allows both a high degree of confidence in the finished design and a relatively low level of effort required to complete it. Computer-aided design systems, hereinafter referred to as CAD systems, are well known in the present art. Such systems are in wide use in a number of engineering disciplines for the purpose of facilitating the design of such things as: electronic circuits and circuit boards (electronic CAD, or ECAD systems), mechanical systems (mechanical CAD, or MCAD systems), software (computer-aided software engineering, or CASE), and integrated circuits (also known as ECAD systems). Of particular relevance to the present invention are those ECAD systems used to design, simulate and layout integrated circuit chips and circuit boards comprising a number of discrete chips.

ECAD systems of this type have been in use for many years. Specific examples of such systems include ECAD systems provided by Mentor Graphics, Inc. of Beaverton, Oreg., Valid Logic Systems of Mountain View, Calif., and LSI Logic Corporation of Milpitas, Calif., among others. In all cases, these ECAD systems comprise a set of software tools running on a computer-based workstation. Typically, such tools include a schematic editor, a circuit compiler, a linker, a simulator, and layout tools. The normal flow of operation is "serial" in that the designer runs the schematic editor to create a design, which is stored in a design dataset. Then the designer exits the editor and runs a compiler which processes the design dataset producing another design dataset. This is then "linked" which produces yet another design dataset, and so on.

An example of such software tools is given by the MDE (Modular Design Environment) system produced by LSI Logic Corp. of Milpitas, Calif. This system runs on a Sun Microsystems workstation, running the UNIX operating system and the SUNVIEW windowed graphical user interface, and includes a schematic editor (LSED), compiler, linker, logic simulator (LSIM), layout editor, bonding editor, floorplanning utility, and design rule checker.

Designers spend most of their integrated circuit design time engaged in a process which has become known as an "edit-compile-simulate" loop. This process involves creating and/or modifying one or more schematic diagrams with a schematic editor, compiling and linking the newly entered/modified design, and then running a simulator to determine whether or not the new design will perform as expected. If not, as is often the case, or if there are some enhancements or improvements to be made, the designer will return to the start of the process; re-editing, re-compiling and re-simulating repetitively until he is satisfied that the design performs as expected.

Another reason designers spend a great deal of time in the "edit-compile-simulate" loop is that many designers will test a design incrementally as it is created by simulating any previously design work along with some new design work. In this manner, confidence in the design is established in small steps, requiring a great deal less effort and insight at any given time than trying to test (and debug) a large design all at once. A designer or group of designers may make many cycles through this process before completing a design.

Because of the repetitive nature of the design actions taken in creating an integrated circuit design, any reduction in the amount of time required to perform any of these repeated steps will reduce the total design time by an amount as many times greater than the time savings as the number of cycles through the edit-compile-simulate process experienced by the designer.

A weakness in many present ECAD systems is that the design process is divided into two relatively isolated processes: design and layout. The design part of the process involves schematic capture, compilation, and linking; while the layout part involves layout floorplanning, component placement, signal routing, analysis of the layout for parameters such as parasitic capacitance, and back-annotation of the original design with information derived during the layout process. After the layout, the designer will likely re-simulate for the purpose of locating any layout-induced problems. If there are any problems, the edit-compile-simulate process will be repeated, this time extending the process to include layout. Because of the relative isolation of the layout process from the rest of the design process, layout is also performed serially, often being performed using software tools (programs) having user interfaces which bear little or no resemblance to those of the software tools used during the design process. An example of a floorplanner is found in commonly-owned U.S. Pat. No. 4,918,614, entitled HIERARCHICAL FLOORPLANNER, issued on Apr. 17, 1990 to Modarres, Raam and Lai.

Much of the design process is repetitive or predictable. The designer makes changes to a circuit design, then compiles, links, simulates, etc. This process usually requires the designer to run the same programs and provide them with the same or similar inputs over and over. This process of manually running programs and re-entering input parameters, re-executing processes which have already been performed before and which have already provided much the same results, etc., can be quite time-consuming.

Accordingly, it is desirable to provide design tools which remove from the designer the task of manually running iterative simulations to achieve an acceptable circuit design.

SUMMARY

An electronic computer aided design system provides for automated operation of a plurality of design tools to produce multiple design solutions to an initial circuit layout. Through the user entry of relative weights for: power, timing and area, different solutions to an initial layout can be generated exhibiting the requested balance of improvements over the original layout. A novel parts placement apparatus and process is disclosed which prioritizes the reconfiguration of the initial design in a manner which assures that the multiple solutions will be generated which exhibit improved performance over the original layout in accordance with the priorities established by the user. A novel compaction apparatus and method is disclosed. A method and apparatus for generating multiple solutions to an initial electronic layout of cells is disclosed. The method for generating multiple solutions comprises:

locating critical paths in the initial layout and each critical path containing line segments joining adjacent cells which are saturated;

defining a cut list including critical cuts and each of the critical cuts severing the critical paths located in said act of locating, and each critical cut including at least one cell from each of the critical paths; and removing and replacing the at least one cell associated with selected critical cuts to produce a solution list including solutions to the initial electronic layout, and the solutions differing from the initial layout in the relative placement of the cells.

In another embodiment of the invention, an apparatus for generating multiple solutions is disclosed which comprises:

means for locating critical paths in the initial layout and each critical path containing line segments joining adjacent cells which are saturated;

means for defining a cut list including critical cuts and each of the critical cuts severing the critical paths located in said act of locating, and each critical cut including at least one cell from each of the critical paths; and means for removing and replacing the at least one cell associated with selected critical cuts to produce a solution list including solutions to the initial electronic layout, and the solutions differing from the initial layout in the relative placement of the cells.

In another embodiment of the invention a computer usable medium having computer readable program code means embodied therein for compacting an initial electronic layout of cells within an initial layout boundary is disclosed. The initial layout boundary includes opposing bottom and top edges; and the computer readable program code means in said article of manufacture comprises:

computer readable program code means for forming paths extending from the bottom edge to the top edge and the paths intersecting cells of the initial layout, and the paths each including line segments linking a lower cell to an upper cell;

computer readable program code means for determining which of the paths are critical paths, each critical path containing line segments all of which are saturated;

computer readable program code means for removing cells of the initial layout associated with the critical paths determined during said act of determining; and computer readable program code means for replacing the cells removed during said act of removing, into the initial layout boundary in a location which allows the initial layout boundary to be reduced in a dimension.

DESCRIPTION OF THE FIGURES

FIGS. 10A–C and 11A–C show the run-time records generated by the automated design processes.

FIGS. 12A1–C2, FIGS. 12D1–F2, FIGS. 12G1–H2 show graphically processes associated with cell/sub-cell placements to generate multiple solutions to an initial part layout.

FIGS. 15A–B show various phases in the growth of the solution list generated by the processes shown in FIGS. 13–14.

DETAILED DESCRIPTION

The following description is presented to enable a person skilled in the art to make and use the invention, and is provided in the context of a particular application and its requirements. Various modifications to the preferred embodiment will be readily apparent to those skilled in the art and the general principles defined herein may be applied to other embodiments and applications without departing from the spirit and scope of the invention. Thus, the present invention is not intended to be limited to the embodiment shown, but is to be accorded the widest scope consistent with the principles and features disclosed herein.

Figure 1:
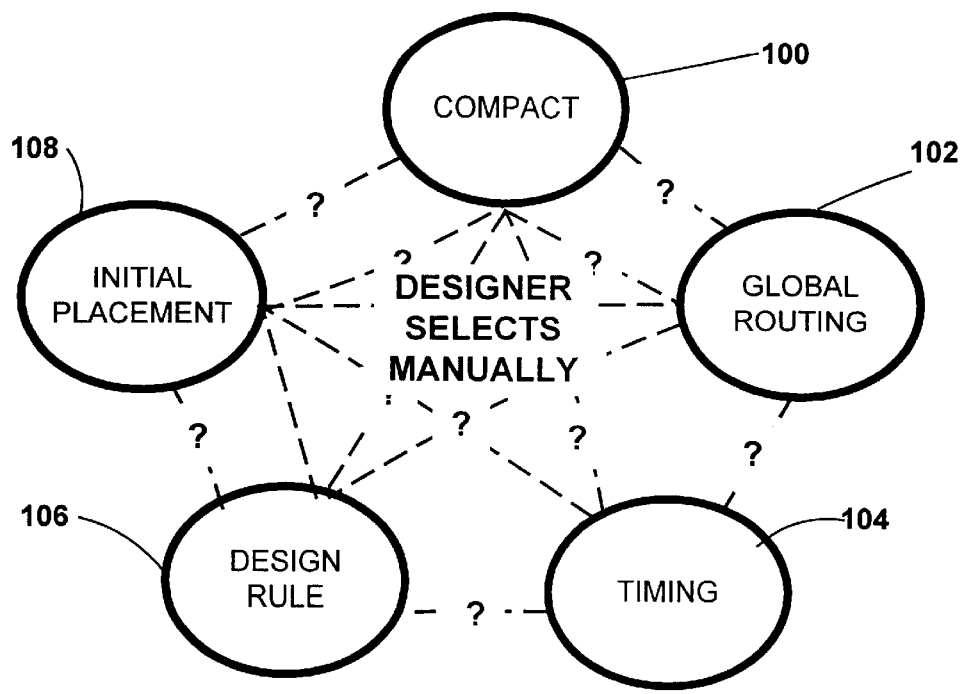
FIG. 1 shows the software modules associated with the electronic computer aided design tools of the prior art.

FIG. 1 shows a prior art arrangement of software modules for electronic design and analysis computer aided design systems. The system includes a number of individual modules 100–108 which allow the design or the capability to select an initial cell placement (initial placement module 108) to compact the arrangement (compaction module 100), to perform global routing to connect the various cells in the compacted arrangement (global routing module 102) to confirm that the design does not violate any rules (design rule module 106) and to conduct timing analysis on the completed design (timing module 104).

The designers spend most of their time engaged in the process known as "Edit-Compile-Simulate" Loop. This process involves modifying one or more schematic diagrams in the schematic editor, compiling and linking a new modified design and then running a compactor or simulator or timing module to see whether the new design will perform, and as is often the case, if there are some enhancements or improvements to be made, the designer will restart the process, re-edit, recompile repetitively until he is satisfied with the result.

Figure 2:
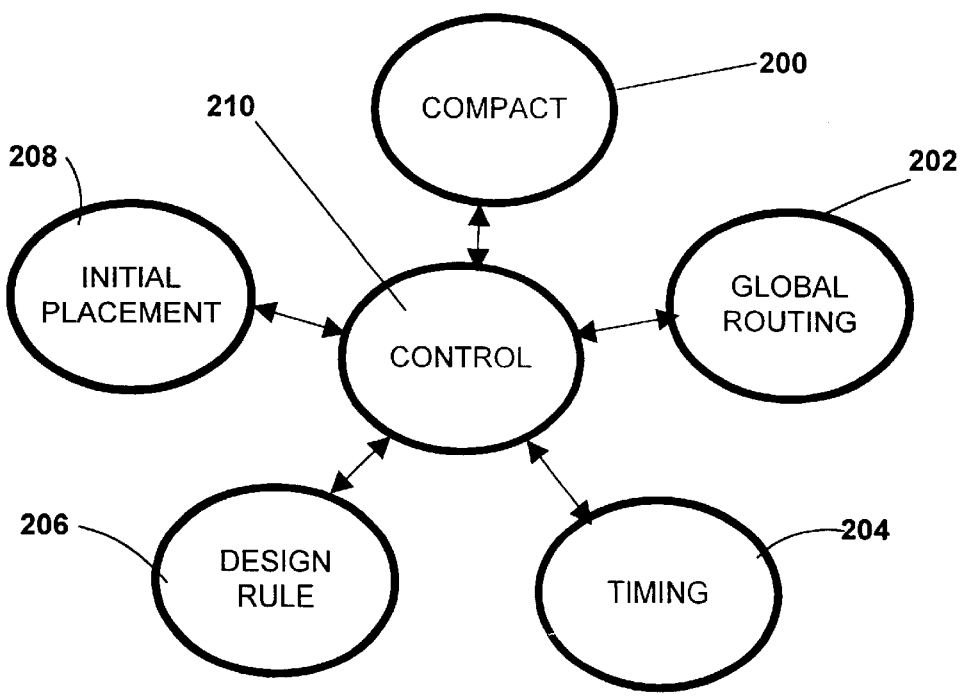
FIG. 2 is a software module diagram of the software modules of the current invention for electronic design and analysis.

FIG. 2 shows the software module layout for electronic design and analysis according to the current invention. In contrast to the prior art design which requires the designer to activate individual modules, the current design provides a control module 210 for coordinating the activities of various EDA tools including: compaction module 200, global routing module 202, timing module 204, design rule module 206 and initial placement module 208. The global routing module 202 is an incremental, re-entrant, layer-based global router. It honors topological timing and power constraints. It has a net layer and smart board assignments. It enables accurate pre-detailed routing of Resistor and Capacitor (RC) parasitic extraction. It incrementally adjusts for block moves, reshaping, hierarchy modification, net list changes and topology constraint changes. The initial placement module 208 generates an initial floorplan. The compaction module 200 is a one-dimensional compactor used for floorplan legalization and fine tuning. The compactor implements processes that automatically move a cell to a completely different location in the initial layout provided an improvement in user configured design parameters results. The compactor supports cell movements including rotation, aspect ratio alterations, and shape changes. The compactor also supports the automatic substitution of equivalent cells during the compaction processes.

The control module 210 has as major responsibilities: constraint partitioning, budget allocation and flow execution control of each of modules 200–208. The setting of budgets, conditions, and flow for each of modules 200–208 is done by the control module. The control module includes an application dispatcher which invokes or launches different software modules, and monitors their activity. Concurrent execution by the modules is provided for. The control module has an automatic design tree traversal and dynamic budget allocation and it sets or changes the software module parameters based on the user configured processing budget and the intermediate results.

The control module 210, in addition to coordinating the activity of the software modules 200–208 to achieve a single design goal, also has the capability of presenting to the user multiple solutions to an initial layout. A designer may select target parameters for the final design in terms of for example: power, timing and area; and the control module orchestrates the software modules 200–208 to achieve alternate layouts, a.k.a., solutions to the initial layout which meet the user's target parameters. This latter feature is extremely useful in that it allows the designer to produce automatically several solutions exhibiting varying degrees of improvement with respect to the initial layout in terms of, for example: area, timing, and power parameters.

Figure 3:
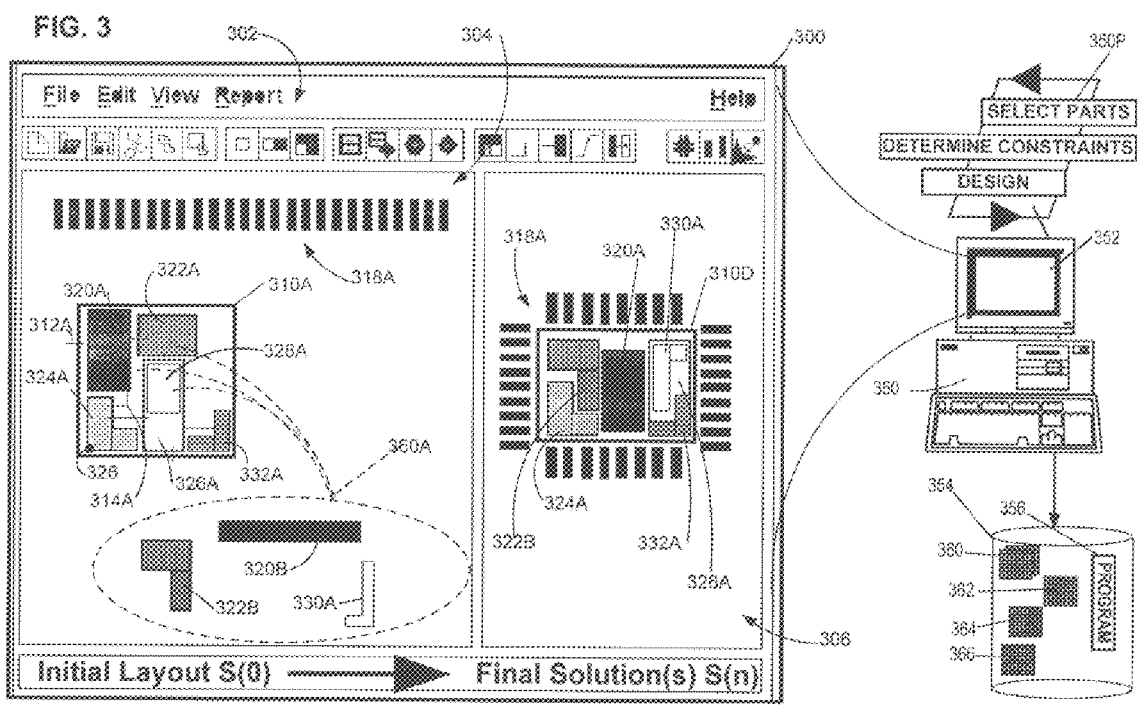
FIG. 3 shows the graphical user interface as associated with an initial layout and a final optimized design.

FIG. 3 shows a graphical user interface 300 on which the initial parts layout, a.k.a., solution S(0) and one or more optimized final solutions S(n) are shown. The graphical user interface (GUI) includes a toolbar 302, an initial layout window 304, and a solution window 306. In the parts selection window, a plurality of pads 318A are shown. The cells/sub-cells, a.k.a., components/sub-components of an initial layout, i.e., cells/sub-cells 320A, 322A, 324A, 326A, 328A and 332A are shown within an initial layout boundary 310A. Each of cells has external connections 312A and internal connections 314A. A plurality of cells representing alternate shapes of or substitutes for the cells of the initial layout are present in the node file 360A (represented with an elliptical highlight). Cell 320B in the node file 360A is an alternate shape for cell 320A in the initial layout. Cell 322B in the node file is an alternate "L" shape for the rectangular cell 322A in the initial layout. Cell 330A in the node file is a substitute for cell 328A shown in the initial layout. This cell not only has different geometry, but may have device features dissimilar to the cell 328A for which it may be substituted to meet user optimization requirements. Cell 324A is shown in a corner of the initial layout boundary 310A, with a corner marker 326. The corner marker indicates that the user has fixed the location of this cell relative to the boundary 310A, thus preventing its movement in subsequent phases of the design optimization processes.

In solution window 306, each of the parts shown in initial layout window 304 has been placed by the design optimization processes of the current invention, within a new boundary 310D in different relative locations than in the initial layout. Cell 330A has been substituted for cell 328A, cell 322B has been substituted for cell 322A. The boundary 310D of the final design encompasses less area than did the boundary 310A of the original layout.

The graphical user interface 300 is exhibited on display 352 of computer 350. The computer is linked to a memory 354. The memory includes program code 356 for the solution generation processes 350P which handle initial layout, setting of constraints and execution of design optimization and multiple solution generation based on the initial layout. Without departing from the teachings of the invention, the solution generation processes 350P can be implemented for either integrated circuit design or for component layout on a printed circuit board. The memory 354 includes program code 356, initial files 360, setup files 362, and run-time files 364 and solution files 366.

Figure 4:
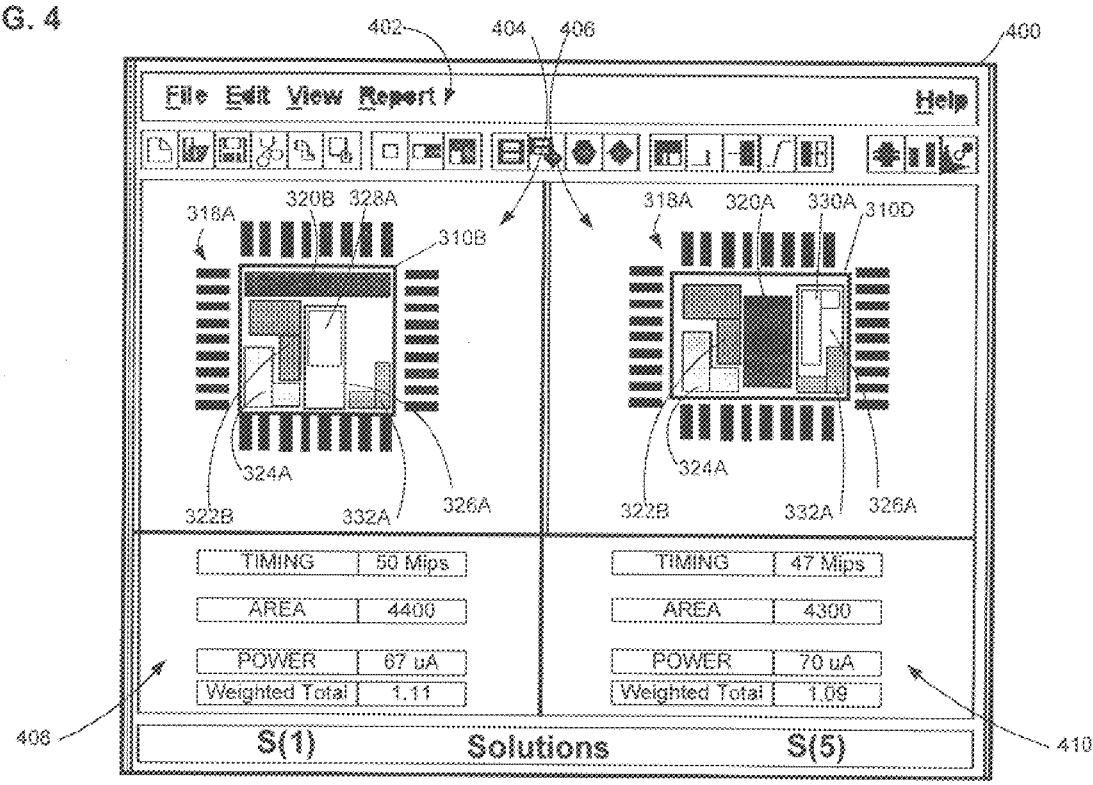
FIG. 4. is a graphical user interface showing multiple optimized design solutions and performance parameters relative to the initial layout shown in FIG. 3.

FIG. 4 shows a graphical user interface in which multiple solutions originating from the initial layout shown in window 304 in FIG. 3 are presented. The GUI for displaying multiples solutions 400 includes: a toolbar 402, at least a first and second solution window 404–406 and a corresponding pair of parameters windows 408–410 for displaying the absolute or relative electrical characteristics of the optimized design solutions in terms of: timing, area and power parameters for the multiple solutions generated by the solution generation processes 350P, e.g. solutions S(1) and S(5). In the example shown the absolute values of these parameters are shown as well as the weighted total of the parameters in comparison to the initial user generated layout shown in FIG. 3.

Solution 1 displayed in window 404 has a different layout than solution 5 displayed in window 406. The layouts differ in the overall area with solution 1 having an area of 4400 units squared and solution 5 having an area of 4300 units squared. Solution 1 has a slightly higher processing speed than solution 5, i.e. fifty million instructions per second (MIPS) as opposed to 47 MIPS. Solution 5 has a slightly higher power consumption than does solution 1, i.e., 70 uA as opposed to 67 uA. Solutions 1 and 5 have respectively weighted total scores of 1.11 and 1.09 relative to the initial layout to which a score of 1.00 is assigned. Further discussion of relative evaluation parameter weights will be set forth in connection with FIG. 7. Solution 1 has all the parts originally laid out in window 304 for the initial layout shown in FIG. 3 albeit in different locations. The solution generation processes 350P for automatic design and layout processes have in solution 5 made various cell substitutions and shape alterations including the alteration of the shape of cell 322A to shape of cell 322B, and the substitution of cell 330A for cell 328A.

In the first solution shown in the window 404 cells 320B, 322B, 324A, 326A, 328A and 332A are shown connected to one another and to pads 318A within boundary 310B. In solution 5 shown in window 406 cells 320A, 322B, 324A, 326A, 330A, and 332A cells are shown connected to one another and to pads 318A within boundary 310D. The boundaries 310B and 310D differ slightly in areas as shown in parameter windows 408–410. As will be obvious to those skilled in the art, the solutions generated by solution generation processes 350P can be displayed in any number of graphical formats, including bar and line graphs. These graphs can exhibit comparative or absolute values for the target parameters by which each of the solutions is evaluated. Target parameters may be displayed in terms of the relative increase or decrease of target parameters, e.g., power, timing or area, with respect to the original layout shown in FIG. 3.

Figure 5:
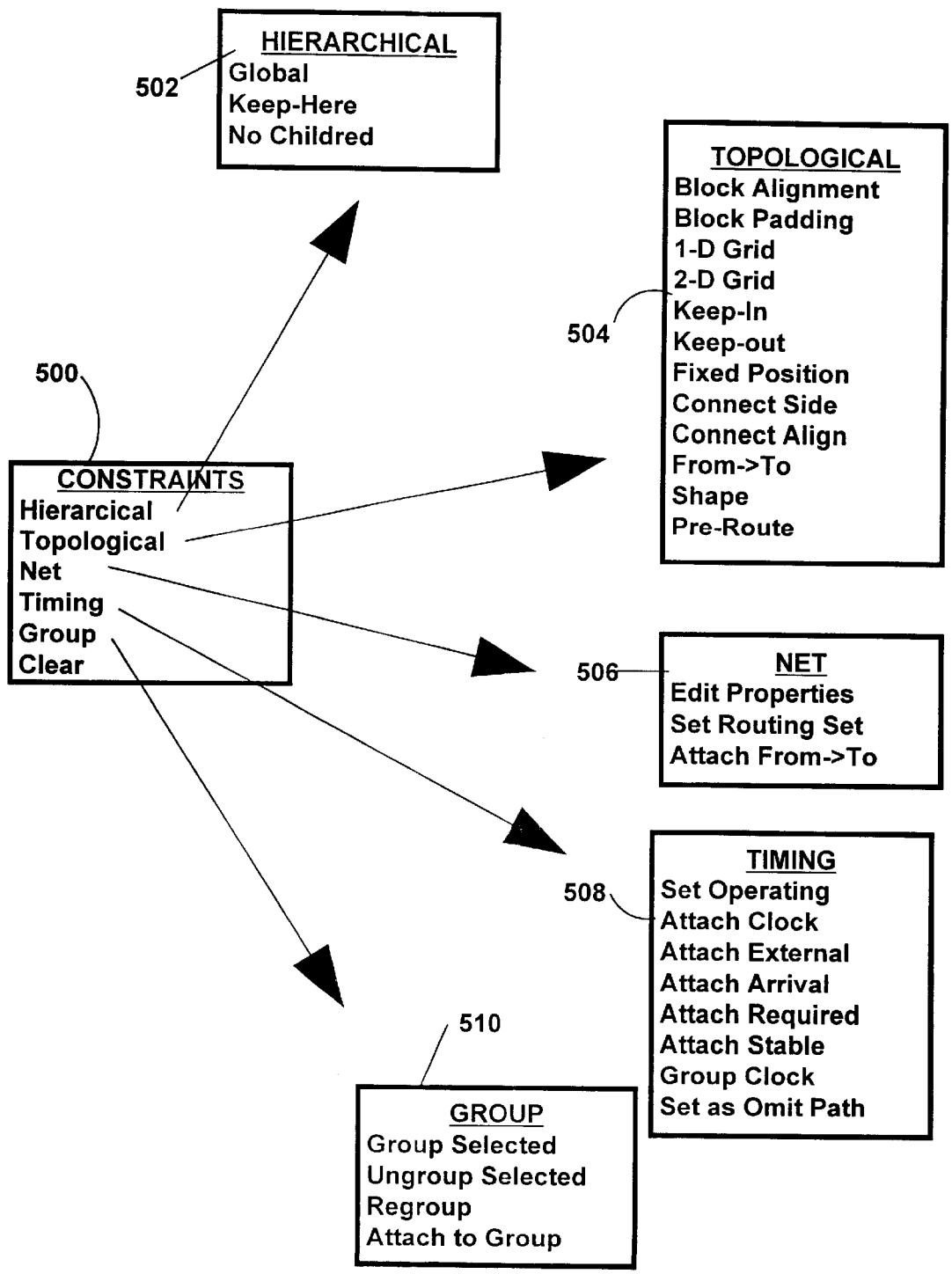
FIG. 5 shows graphical user interfaces associated with the user entry of constraints for the automated design processes.

FIG. 5 shows the initial graphical user interfaces for setting user constraints. A constraint menu 500 is shown. The constraint menu allows the user to enter various constraints including: hierarchical, topological, net, timing and group constraints. The user enters hierarchical constraints through GUI 502, in which the relationships between various components/cells and their subcomponents/sub-cells is defined. The user enters topological constraints through GUI 504. Examples of topological constraints include: a cell whose location is fixed relative to another cell, a pad, or a boundary; an area within the boundary in which a specific cell must be, or alternately cannot be, placed. These constraints are observed by the automated design processes. The user enters net constraints through GUI 506. A net can include for example a signal net, a special power and ground net, a clock net, etc. Examples of net constraints include: a netlist indicating connections that need to be made between cells, or between a cell and a pad. A net can include design rules including wire width and spacing. These constraints are observed by the solution generation processes 350P. The user enters timing constraints through GUI 508. Timing constraints include: the clock which is driving a component, the frequency of a clock, and the minimum clock delay between two connections on a netlist. The user enters group constraints through GUI 510. An example of a group constraint is a grouping of cells in the initial layout which requires that they be placed in fixed relationship to the other cells in the group in both the initial layout and the final optimized design The user may mouse select cells to be grouped together.

Figure 6:
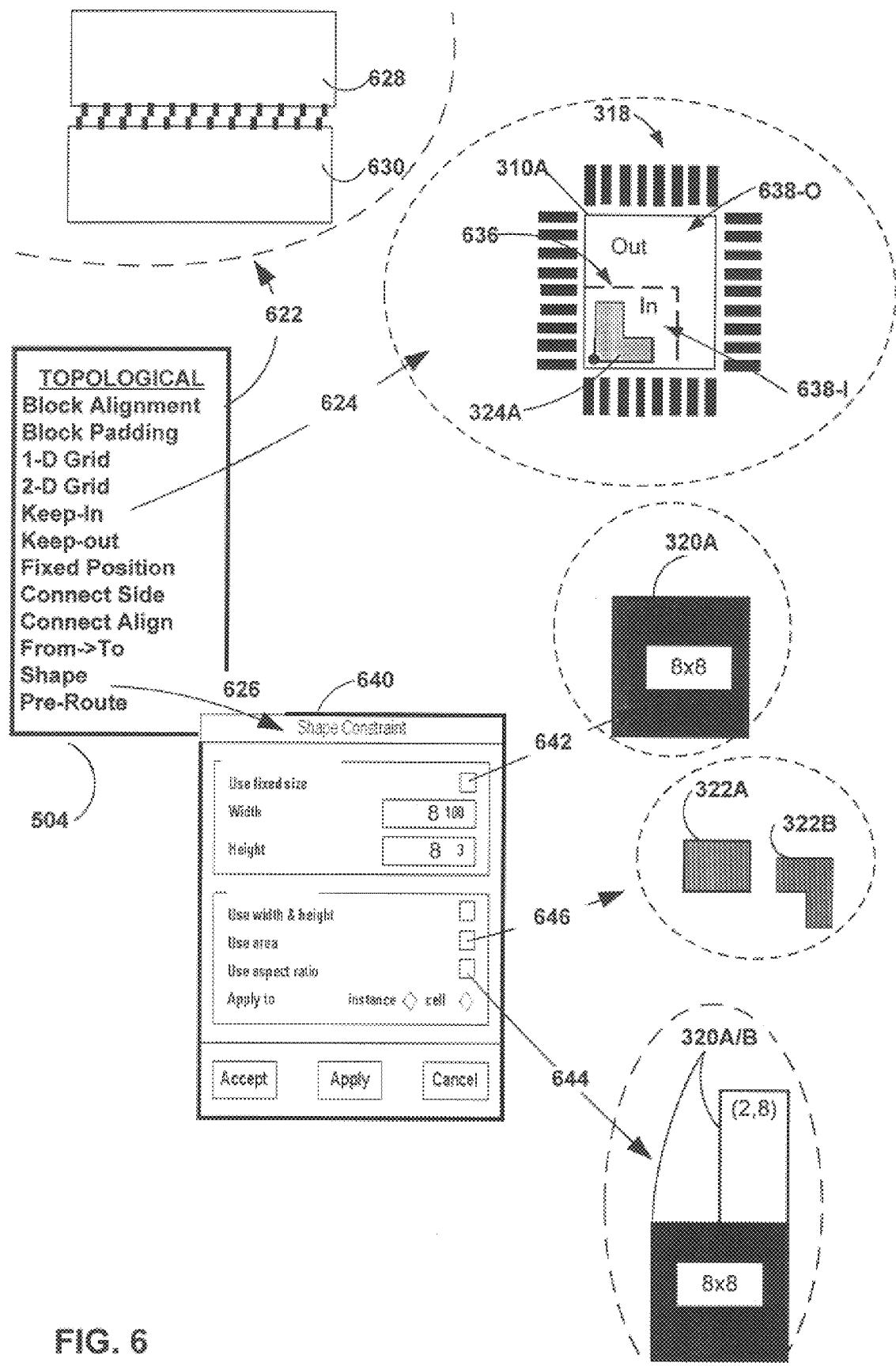
FIG. 6 shows greater details on the graphical user interfaces associated with the entry of the topological constraints shown in FIG. 5.

FIG. 6 shows several examples of the constraints that can be set using the GUI 504 shown in FIG. 5. When the block alignment constraint 622 is selected from the topological menu, two or more cells may be aligned with respect to one another. In the example shown, two longitudinal edges of cells 628–630 are aligned with respect to one another to reduce the routing between connection points. The user enters this constraint by moving the cells into alignment and by activating an alignment icon (not shown). The user may also enter area constraints via the topological menu. When keep-in constraint 624 is chosen an area on a cell or within a boundary may be defined for the placement of one or more cells. This and all other constraint operations can be performed at any stage of the automatic layout process. In the example shown, the boundary 636 for the chip 324A has been defined within the chip boundary 310A. The boundary defines the partition between an area 638-I within which cell 324A can be located by the automatic layout processes disclosed herein. The remaining area 638-O is an area in which the cell 324A is not to be placed.

When the shape constraint 626 is chosen from GUI 504 a submenu 640 may be displayed. A submenu allows shape constraints for the cell to be set. For example, if the user selects fixed size for the cell then they may enter the width and height dimensions of the cell. Those size constraints will be stored in a constraint file and will be observed by the solution generation processes 350P (see FIG. 3) during layout optimization. The cell will be fixed in size without alteration, regardless of the alternate shapes that might exist for that cell, throughout the automated layout processes. This option 642 is selected on the shape submenu 640. The reader will note that a cell which is fixed in size may nevertheless be rotated if no other constraint causes that operation as well to be prohibited by the automatic design and layout processes. Another example of a shape constraint is a fixed cell area 646. Cells with fixed area may have different shapes provided only that the overall area is the same. Cells 322A and 322B have equivalent areas and different shapes, i.e. "rectangular" and "L" shapes. This is one of the more flexible constraints in that a variety of cell shapes each with different geometries can be utilized by the design processes, provided they do not violate the fixed area constraint. Another example of a shape constraint is the defining of different aspect ratios for a cell. The selection by the user of an aspect ratio 644 on submenu 640 enables on subsequent menu (not shown) on which the user may enter a range of aspect ratios for a cell, e.g., 320A (see FIG. 1). This cell will be utilized during the design processes with the flexibility of a variation in aspect ratios providing a useful degree of freedom in placing the cell into the final design.

Figure 7:
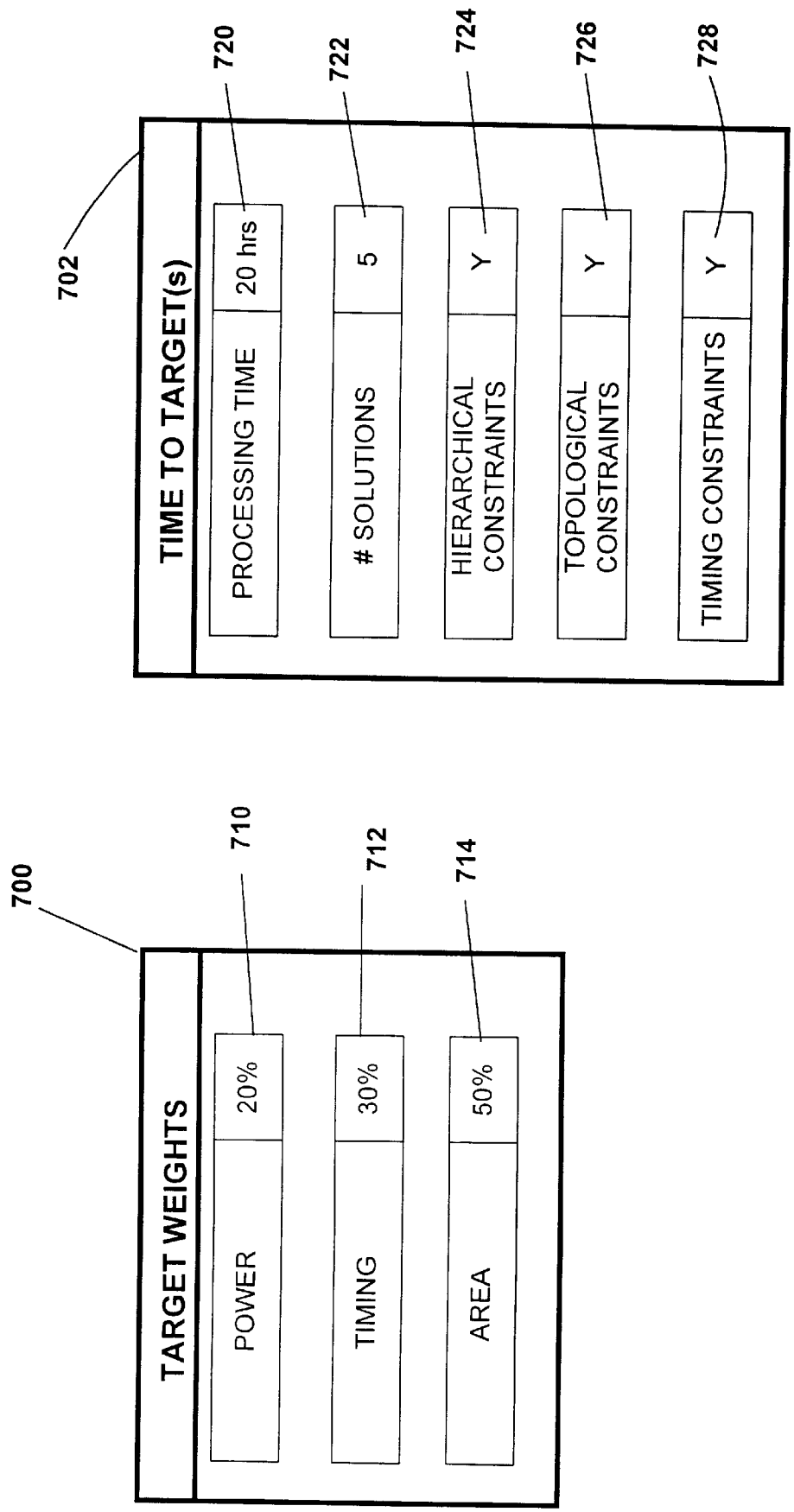
FIG. 7 shows two graphical user interfaces for user entry of parameters to govern the automated design processes.

FIG. 7 shows the graphical user interfaces for setting target parameters and processing constraints for the solution generation processes 350P (see FIG. 3) of the current invention. Two graphical user interfaces 700–702 are shown. Graphical user interface 700 includes three fields 710–714 in which the user establishes relative weights for the parameters by which solutions will be evaluated. In the example shown solutions are evaluated in terms of power (20%), timing (30%) and area (50%). The relative weights are utilized to guide the solution generation process 350P to solutions which meet the users targets. For example, a high weight assigned to the area of the final design will cause the automated processes to select or generate solutions having a compact design even though those solutions may not have the least power consumption or the highest processing speeds. Alternately, if a user gives a higher weight to timing than to either power or area, then the automated processes will provide solutions which optimize timing even though the overall size of the final design may be larger and consume more power.

GUI 402 allows the user to set the overall amount of time and/or processing cycles and the number of solutions to be provided by the automated design processes. Window 720 displays a selected processing time of 20 hours. The processing time could alternately be selected in terms of processing cycles or as a percent utilization of a processor's bandwidth. The next field 722 allows the user to input the total number of solutions to be generated by the automated design processes. The following fields 724–728 allow the user to enable/disable, respectively the hierarchical, topological and timing constraints (see FIGS. 2–3) during the automatic design optimization processes.

Figure 8:
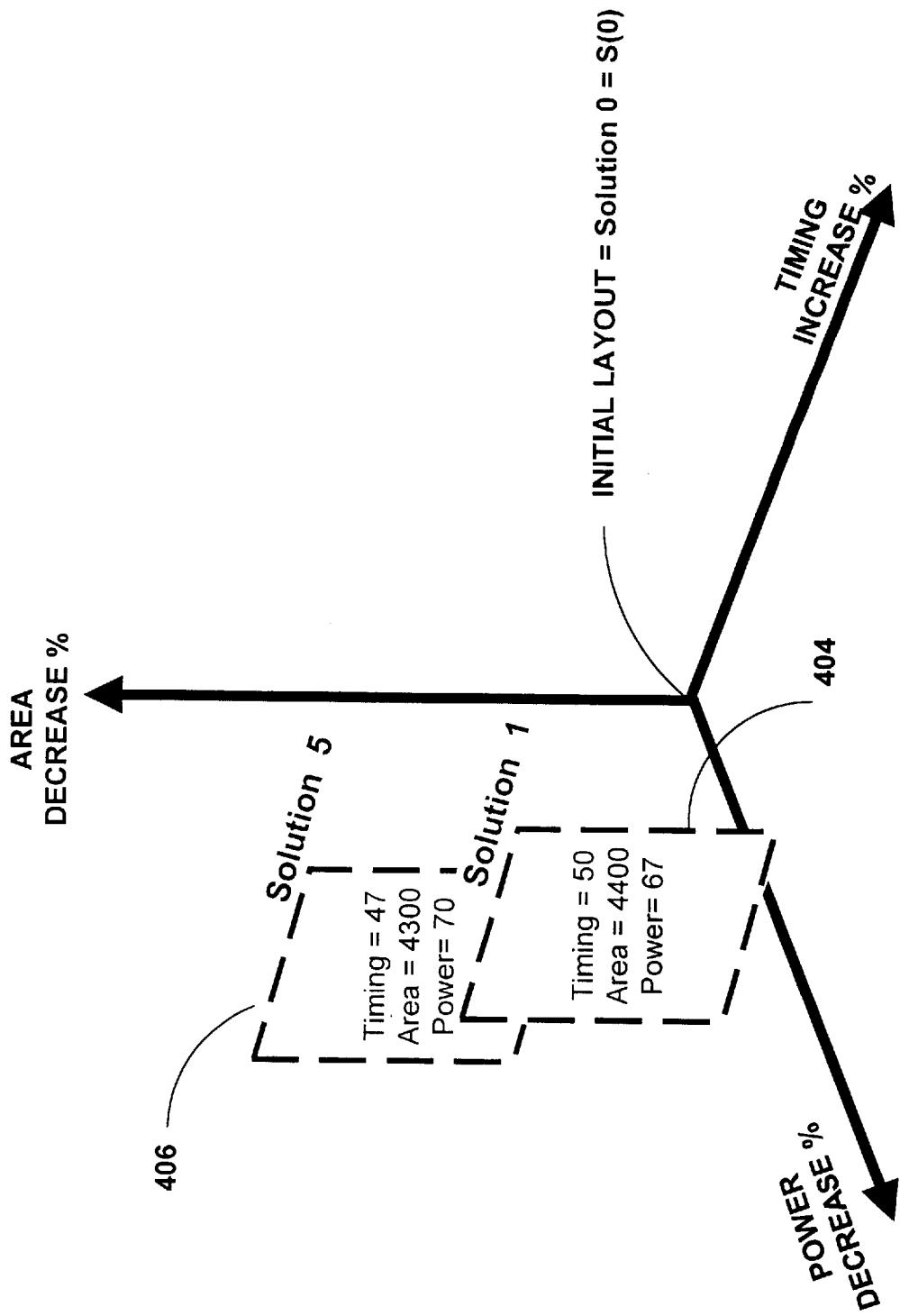
FIG. 8 is a graph showing the parameters which the user may vary in order to effect the automated design processes.

FIG. 8 shows a graphical representation of the relationship between the initial user generated layout (see FIG. 3) and the multiple solutions generated by solution generation processes 350P. A three-dimensional graph is shown with the positive portion of the x,y,z axis labeled respectively as timing (clock speed increase %), area (decrease %), and power (decrease %). The origin of the graph corresponds to the values for power, timing, and area of the initial user generated layout (see FIG. 3). The automatic design optimization processes generate solutions that occupy portions of the three-dimensional graph space that vary depending on the target parameters set by the user (see FIG. 7). The solutions could be displayed in a GUI similar to FIG. 8. In the example shown, the axes on the graph are expressed in percentage units, corresponding to the percentage improvement of each solution relative to the original layout in terms of parameters such as: power, timing and area. Solutions 1 and 5 which appear respectively in solution windows 404–406 (see FIG. 4) are shown. In an alternate embodiment of the invention the axis of the graph could be incremented in absolute values of the parameters rather than relative values.

Figure 9A:
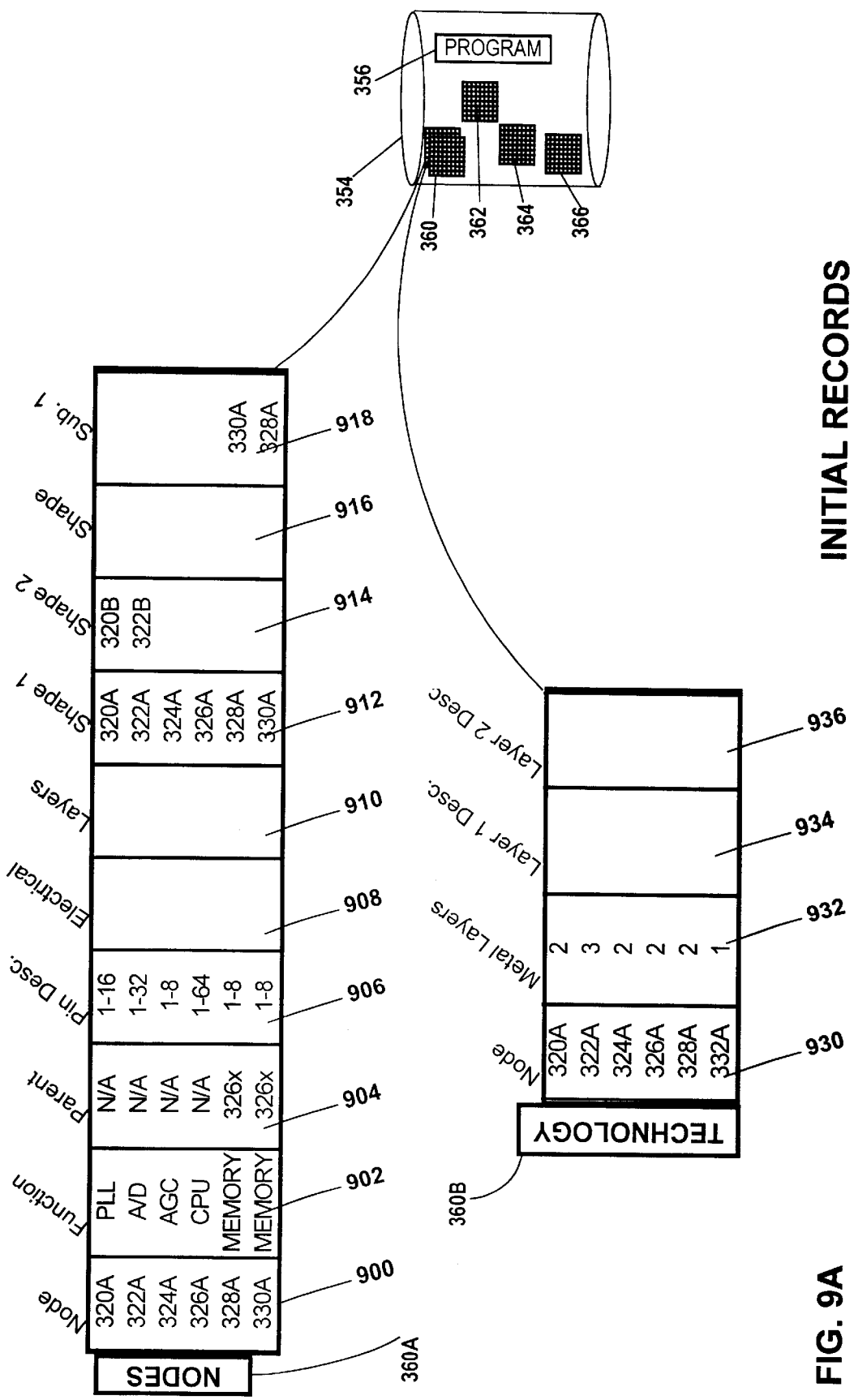
FIGS. 9A–B show respectively the initial and set-up records utilized by the automated design processes disclosed herein.
Figure 9B:
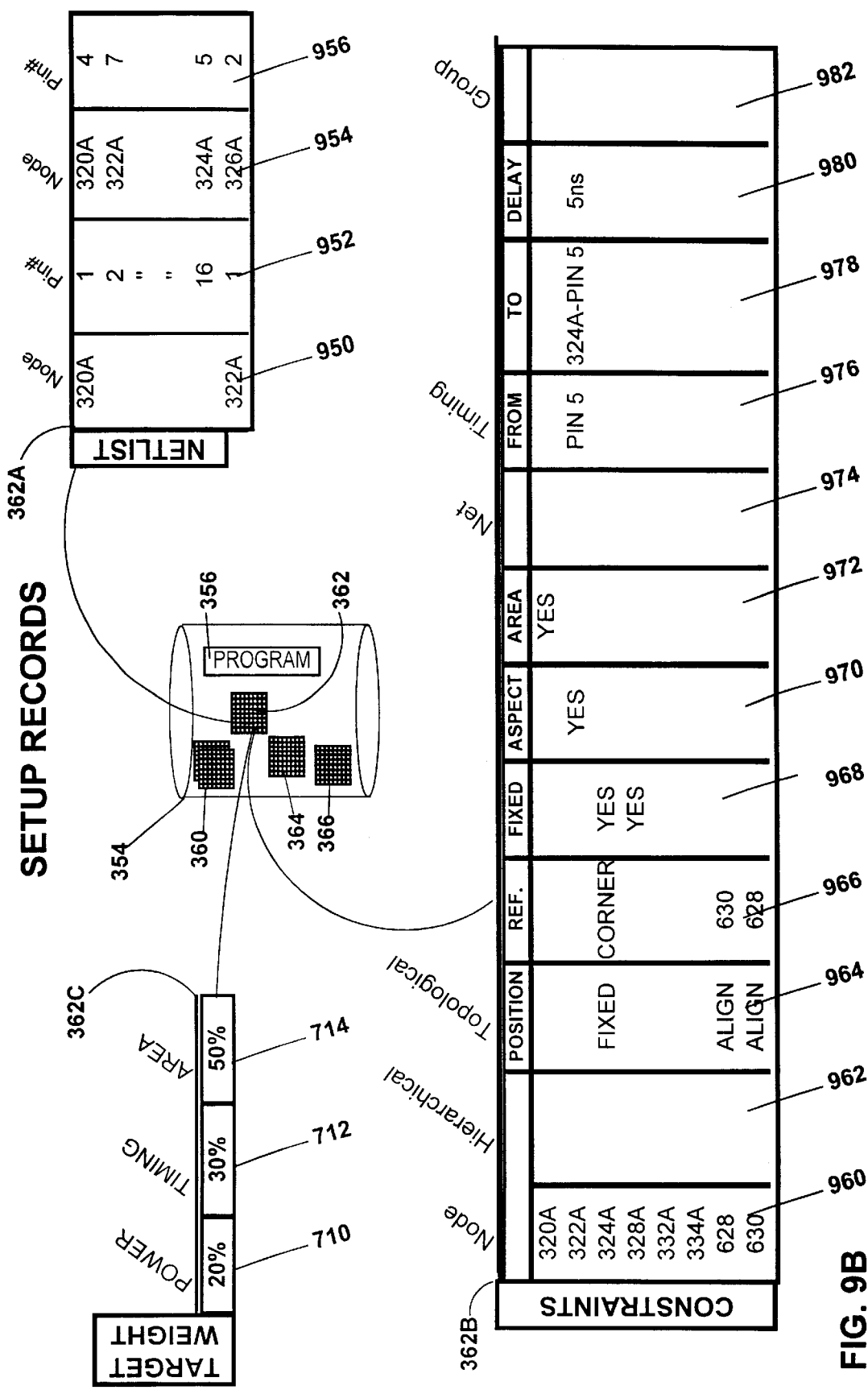

FIGS. 9A–B show respectively the initial and set-up records on the memory 354 shown in FIG. 3. The initial records shown in FIG. 9A include: the records in node file 360A and the technology records in node file 360B. The setup records shown in FIG. 9B include: the net list records contained in file 362A, the constraint records contained in file 362B and the target weight record contained in file 362C.

The initial records in node file 360A–B shown in FIG. 9A should be present in memory 354 before execution of the solution generation processes 350P (see FIG. 3). This file contains a record for each node in the layout. Each node corresponds to a cell/sub-cell in the user generated layout. Each record may include the following fields: node field 900, function field 902, parent field 904, pin description field 906, electrical characteristic field 908, layer field 910, shape fields 912–916 and substitute cell fields, e.g., field 918. Multiple node records are shown in node file 360A. The node field 900 indicates the name by which the particular cell/sub-cell is identified. The function field 902 indicates the function of the cell/sub-cell, e.g., memory cell, CPU, analog gain control (AGC), analog-digital converter (A/D), and phase lock loop (PLL). Parent field 904 indicates which cells are parent to the cell. In the example shown, nodes 328A–330A have respectively the same parent node, i.e. cell 326x (see FIG. 3). These cells are therefore part of and defined within the boundaries of their parent. The pin description field 906 lists each of the cells connections and the functional requirements for each of those connections. The electrical characteristic field 908 lists the electrical characteristic for the cell. Electrical characteristics include: voltage, power, timing and phase information for each of the cells connections. The layer field 910 indicates the number of layers in the cell and the shape properties of each of those layers. In an embodiment of the invention, this field contains the information about under-utilized portions of each layer, e.g., portions of the layer which do not extend to the boundaries of the cell and therefore could be used for routing or placement of other layers of adjacent cells. In an alternate embodiment of the invention, this information is utilized by the design optimization processes to allow area compaction and/or parameter improvement through overlapping of adjacent cells in the underutilized layers. Fields 912–916 list alternate shapes for the cell/sub-cell listed in node field 900. For example, node 320A (see FIG. 3) has two alternate shapes 320A–B one approximately square and the other rectangular. These are listed in fields 912–916 in the record for that cell. Node 322A (see FIG. 3) has two alternate shapes 322A–B one rectangular and the other "L" shaped. Either shape may be substituted for the other to produce a solution with operational parameters superior to the initial user layout. A final field 918 lists equivalent cells/sub-cells which may be substituted for a specific node. These will have similar functional properties but different layer/shape properties making them useful in implementing the automatic design and layout processes. The records for both cells 328A–330A show that respectively cells 330A–328A are substitutes (see FIG. 3).

The next of the initial files is the technology file 360B which contains individual records for each node. For each node the technology name, the processes, any inherited technologies, and the resolution may be recorded. In the example shown, the technology file also contains for each record: a node identifier field 930, a metal layer field 932 indicated the number of metal layers in the cell/node, and a plurality of layer fields of which fields 934–936 are shown. The layer fields list for each layer, for example: the minimum width, spacing, wide rule width, wide rule spacing, height, thickness, shrink factor, mask level, GDS2 level, fringe capacitance, perimeter capacitance, area capacitance, resistance, layer name. In a preferred embodiment of the current invention all records are relationally linked in a database format.

FIG. 9B shows setup records, created subsequent to the initial part placement shown in FIG. 3. The netlist file 362A, the constraint file 362B, and the target weight file 362C are shown. The netlist file contains a listing of all connections between each of the cells in the original layout. The second of these files is the constraint file 362B which contains all the user constraints for the layout discussed above in FIGS. 5–6. The target weight record contains the user inputs discussed above in connection with FIG. 7 for guiding the solution generation processes 350P to one or more of the solutions shown in FIGS. 4, 8 and 15. Each of these files contain a plurality of records which may be relationally linked to one another. The net list file 362A contains: node fields 950, 954 and pin number fields 952, 956. Thus, for each node and all the external connections of the node, the corresponding connections with the other cells/sub-cells of the layout are recorded.

File 362B contains a plurality of records each with a node field 960, a hierarchical field 962, a plurality of topological fields of which fields 964–972 are referenced, a plurality of net fields 974, a plurality of timing fields of which fields 976–980 are referenced and a plurality of group fields 982. The node field 960 contains the name of the cell/sub-cell. The hierchical field 962 contains the hierarchical constraints set by the user and discussed above in FIG. 5. The topological fields 964–972 contain the information entered via GUI 504 (see FIG. 5). This includes position and reference fields 964–966 which indicate the position of a specific cell with respect to some reference such as: a corner of a chip or another cell. In the example shown, cell 324A is listed in field 964–966 as being fixed relative to a corner of the initial cell boundary 310A. The record for cells 628–630 (see FIG. 6), specifically fields 964–966 indicates each cell is aligned with respect to the other. Fields 968–972 indicated whether the user has constrained a cell to a specific shape (field 968) or aspect ratio (field 970) or area (field 972). Fields 974 record the netlist constraints set by the user (see FIG. 5). In the example shown, the record for cell 322A shows in fields 976–980 that a delay of five nano-seconds is the maximum delay for a signal propagating from pin 5 of cell 322A to pin 5 of cell 324A. Field 982 lists the cells with which this record is grouped during the automatic layout processes.

File 362C is the target weight file which contains the weights assigned by the user for guiding the optimization processes (see FIG. 7). The target weight file includes three fields 710–714 in which the relative weights for the optimization processes to evaluate competing solutions are stored. In the example shown solutions are evaluated in terms of power (P), timing (T) and area (A) and these are accorded relative weights of respectively: 20%, 30% and 50%.

FIGS. 10A–C shows graphically and textually, the files initially generated by solution generation processes 350P at the start of the design optimization process.

FIG. 10A shows the initial solution S(0) generated by the user in initial layout window 304 described and discussed above in FIG. 3. Superimposed on the layout are a number of lines proceeding from the bottom edge to the top edge of the initial layout boundary 310A. The line segment between any two nodes or a node and either the bottom or top edge is referred to as an "edge". Connected edges form paths from the top to the bottom of the initial layout. In combination these paths, define all possible routes, layer by layer, from the bottom to the top edge of the design and through all components and subcomponents of the design. In the example shown, all edges originate at a bottom node 1000 on the bottom edge of the initial layout boundary 310A and proceed along various paths through all the components and subcomponents of the layout to the top of the boundary where they terminate at top node 1002. The first set of edges, E1, E3, E4 originate at the bottom node 1000 and link that edge with respectively components 324A, 326A and 332A. The next set of edges originate at the termination points of the first set of edges and proceed upward to the next intersecting components or subcomponents and its corresponding node. The edge E5 connects node 324A to node 320A. Edge E6 connects node 326A to node 328A. Edge E7 connects node 332A to top node 1002. Edge E8 connects node 328A to node 322A. Edge E9 connects node 320A to top node 1002. Edge E10 connects node 322A to top node 1002.

FIG. 10B shows a file 364A (see FIG. 3) in which individual records for each of the edges shown in FIG. 10A are maintained and in which the results of a calculation as to the saturation of an edge are recorded. In the designer's initial layout window 304 (see FIG. 3) components/subcomponents a.k.a. cells/sub-cells may be placed too close to each other to allow subsequent routing connections to be made. When cells/sub-cells are too close to one another to allow routing to be performed the edge between the two cells/sub-cells is said to be "saturated" because there is not enough spacing for routing to take place.

The processes implemented in the current invention determine wire routing on a layer by layer basis. This provides additional degrees of design freedom for optimizing cell layout. First, routing can now be accomplished in unused metal layers within a cell/sub-cell boundary. Second, the device layers of a cell/sub-cell, as opposed to the metal routing layers, may also be underutilized in which instance an adjacent cell/sub-cell may be fabricated in whole or in part on underutilized portions of the device and metal routing layers of an adjacent cell/sub-cell.

The saturation file 364A includes a plurality of records for each edge. Each record includes: an edge field 1010, "from" and "to" fields respectively 1012–1014, direction field 1016, layer field 1018 and saturation field 1020. The edge field, 1010 records the edge identifier. The from and to fields 1012–1014 record the end points of an edge. The direction field 1016 records the vector direction of an edge. The layer field 1018 records for each edge the layer(s) which the edge corresponds to. The saturation field 1020 records the saturation for each layer of the nodes joined by the edge. In an embodiment of the invention, saturation is calculated for each layer by taking the required spacing between a layer of adjacent cells/sub-cells as determined by a global routing process and dividing the required spacing by the spacing which the designer has provided in the original layout window 304 (see FIG. 3). The required spacing "D2" is equal to half the distance from the bottom to the top boundary of an individual layer of one cell plus half the distance from the bottom to the top of the identical layer on the adjacent cell plus the amount of routing area required on that layer between the adjacent cells. The actual spacing "D1" between equivalent layers of nodes linked by each edge is equal to the length of the edge for which the calculation is being performed. A value of 100% for D2/D1 indicates that an edge is saturated, i.e. the required and actual layout spacing are equivalent. A value of greater than 100% for D2/D1 indicates an oversaturated edge in which the spacing between nodes does not provide sufficient room for routing. A value of less than 100% for D2/D1 indicates that the designer's initial placement has left more room between the layers of adjacent cells than is required for routing. In a preferred embodiment of the invention there would actually be an individual record for each of the layers of each edge but for purposes of exposition, those have been reduced in FIG. 10B to a single record. The record for edge 3 layer 3 shows a 100% saturation. Similarly, the record for edge E6, layer 3 also shows 100% saturation. Those same edges, E3 and E6, are not saturated at any of the remaining layers 1, 2, 4, and 5, which are at only 60–70% of saturation. Thus, considerable slack or unused portions of layers 1, 2, 4, and 5 exists in both edges E3 and E6 and therefore within parent cell 326A and child sub-cell 328A. The solution generation processes 350P utilize all of the edge records in the saturation file, including individual layer information for each edge during both the placement of a critical node and for the global routing processes. Thus unused portions of both cells/sub-cells, determined on a layer-by-layer basis, can be utilized for the placement of components/subcomponents and for routing to optimize device design.

FIG. 10C shows a critical edge file 364B which contains a subset of the records of file 364A. The entries in this file are all saturated edges grouped to form each of the one or more critical paths, i.e. paths 1050–1052 from the bottom node 1000 to the top node 1002. There may be more than one critical path from the bottom node 1000 to the top node 1002 (see FIG. 10A). A critical path is a path formed from saturated edge segments which connect the bottom node 1000 to the top node 1002 of the layout boundary 310. For any path to be critical, all the edges of that path must be saturated on at least one layer, e.g. 100% saturation or greater. Not all layers will necessarily be saturated. The critical path file comprises all the fields discussed above in connection with FIG. 10B, specifically the edge field 1010, the "from" and "to" fields respectively, 1012–1014, the direction field 1016, the layer field 1018 and the percent saturation field 1020. The distinction between the two files lies in the records that they contain. The critical path file 364B contains only those edges which are saturated, e.g. 100% or greater and groups those into one or more critical paths. Two critical paths, 1050–1052 are shown. The first of these, critical path 1050, includes edges E1, E5 and E9 which are saturated on at least one layer and which form a continuous critical path from bottom node 1000 through cells 324A and 320A to top node 1002. The second critical path 1052 includes edges E3, E6, E8 and E10, all of which are saturated on at least one layer and form a continuous path from bottom node 1000 through parent cell 326A, child cell 328A, cell 322A to top node 1002. Further compaction of the initial layout will require that cells/sub-cells linked by these critical edges be dealt with. In FIG. 10A the critical paths are identified with solid lines while non-critical paths are identified with dotted lines. Note that although cell E3 and E6 are part of critical path 1052, that it is only at the layer 3 that the critical path is created. Edges E3 and E6 have all layers except layer 3 in a non-critical/non-saturated state and are thus available for routing.

Having determined critical paths, the next step is to determine critical cuts, i.e., node removals which will allow a formerly critical path to be reconfigured to eliminate any oversaturation that may exist and to optimize the users design according to the target parameters set by the user.

Figures 11A, 11B, 11C:
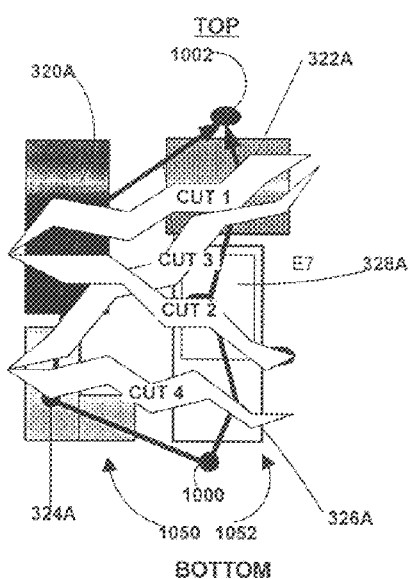

FIGS. 11A–C show a graphical and database perspective of the methodology used to determine where to cut the critical paths 1050–1052 (see FIG. 10C) so as to allow a compaction of the initial layout boundary 310A (see FIG. 3).

FIG. 11A shows the portion of the initial layout involving those nodes which are part of the critical paths 1050–1052 (see FIG. 10C). On those paths a plurality of "cuts" involving different node combinations, at least one from each critical path, are shown. A cut therefore completely severs all the critical paths of a design/solution and is the method by which the optimization of a layout is initiated. Critical paths 1050–1052 are comprised respectively of edges (E1, E5, E9) and (E3, E6, E8, E10).

FIG. 11B shows file 364C, which comprises a plurality of records indicating all the possible combinations of nodes which can be removed from all critical paths, e.g. 1050–1052 (see FIG. 10C), to provide the basis for generating one or more solutions to the user generated layout of the initial layout window 304 (see FIG. 3). Each of the records of path cut file 364C include: a cut ID field 1110, node ID fields 1112–1116, one or more cost fields 1118–1122 and a total cost field 1124. The costs fields provide a way of prioritizing cuts so as to minimize perturbation of the initial layout. Various combinations of parameters may be used to determine the cost of a cut. Costs factors are used to rank or prioritize cuts. In an embodiment of the invention, costs may be calculated in terms of area, netlist, power, timing, etc. The area of the components associated with a cut may be recorded in area field 1118. The number and/or length of the netlist connections associated with a cut may be stored in net field 1120. The measured propagation delay compared with the maximum timing delay set by the user (see FIG. 5) may be used to calculate a timing cost. Where multiple costs are calculated for a cut, the costs may be assigned coefficients corresponding to the weights set by the user for ranking final solutions (see FIG. 7) and the weighted sum or sum of the various costs is stored in total cost field 1124.

FIG. 11C shows each of the records of the critical cut list 364C sorted in ascending order by total cost field 1124. The order in which nodes will be selected for removal and subsequent solution generation processes 350P (see FIG. 3) will be determined on the basis of cost with the lowest cost cuts being selected first. In another embodiment of the invention, an evaluation list will be formed which will contain the lowest cost critical cuts. Each critical cut in the evaluation list will be evaluated by removing and replacing the corresponding components/subcomponents from the initial layout to form new solutions (see FIG. 12), some of which may optimize the user configured parameters (see FIG. 7).

In the examples shown in FIG. 11C, the ordering of the cuts is C3, C1, C4, C6, C2, C5, etc. Other cut combinations are possible but have not been shown. Of those that have been shown, cuts C3, C4 and C6 all include at least two nodes, one of which is listed in constraint file 362B (see FIG. 9) as being fixed with respect to the initial layout location. This node 324A is shown in each of records C3, C4 and C6. Because these cuts contain a fixed node 324A, they will not be considered for subsequent layout optimization processes, which will be described in the following FIG. 12A–J, 13, and 14A–D. The remaining cuts in ascending order of eligibility for subsequent layout optimization processes are cut C1, comprising node 320A from the first critical path 1050 and node 322A from the second critical path 1052 (see FIG. 10C). The next eligible critical cut is cut C2 comprising node 320A from critical path 1050 and nodes 326A–328A from critical path 1052 (see FIG. 10C). The last listed eligible remaining cut is cut C5 containing node 320A from critical path 1050 and nodes 322A, 326A, 328A from critical path 1052 (see FIG. 10C).

The following FIGS. 12A1–C2 show the solution generation processes 350P initiated with cut C1. FIGS. 12D1–F2 show the solution generation processes 350P initiated with cut C2. Finally, FIGS. 12G1–2 show the solution generation processes 350P initiated with cut C5.

The layout optimization initiated by critical cut 1 begins as shown in FIG. 12A2 with the removal of the two nodes 320A–322A associated with cut 1. The boundary 310A of the original layout (see FIG. 10A) is compressed 1200 along a vertical axis and a new compressed boundary 1210A is formed in which all nodes of the original layout remain, except for the critical nodes 320A, and 322A associated with cut 1. Then as shown in FIG. 12B1–B2, channels are formed in the empty spaces within the boundary. Channels are defined vertically downward or upward from every horizonal edge of every cell in the box and additionally from the bottom and top horizontal edges of the boundary. Channels are defined on a layer by layer basis. The number of channels that can be defined for any boundary are defined by the equation C=L(2N+E), where L=the maximum layers, N equals the number of nodes in the boundary and E is equal to the number of horizontal edges in the boundary. As shown in FIG. 12B1, the initial compression 1200 results in a boundary 1210A, none of the channels of which is sufficient to contain any of nodes 320A–322A or their shape variations or substitutes. For this reason, FIG. 12B1 shows the decompression 1202 of boundary 1210A along a vertical axis to form a slightly larger boundary 1210B. This boundary is still smaller in vertical, dimension than the original layout boundary 310A (see FIG. 10A). In this boundary 1210B, eight channels can be defined and three of those channels, 1212–1216 are shown in FIGS. 12B1–B2. The first of these channels, 1212, is defined upward from node 332A. A corresponding channel not shown can be defined downward from that same node. Each channel takes into account all the available space. In the case of a downward channel from node 332A, it would be formed after sliding movable node 332A to the uppermost possible position in the boundary 1210B. The next channel, 1214, is defined upward from node 326/328A. The next channel, 1216, is defined upward from node 324A.

Once channels are defined, they are sorted in ascending order with those having the least absolute cost utilized first for the replacement of the components/subcomponents associated with critical nodes. If more than one critical node is associated with a critical cut, the order of replacement of critical nodes may also be determined on the basis of cost, with the most expensive critical nodes being replaced first.

A channel's cost, like the cost of a critical cut (see above) can be evaluated in many different ways depending on the embodiment of the invention. Cost may be determined for example, on the basis of area, power and timing requirements or constraints and these parameters may be assigned relative weights for the determination of a total cost (see FIG. 7). The "cost" of a channel can be calculated in absolute terms, i.e. invariant for all critical nodes. An example of an absolute cost would be channel width, e.g. the narrowest dimension along an axis orthogonal to the vertical axis along which compression 1200 and decompression 1202 of the boundary is performed. The greater the channel width the more costly it is for any critical node to be placed in it because doing so reduces the height of many of the remaining channels. The "cost" for a channel may also be calculated in relative terms, which vary for each critical node. An example of a relative cost is netlist connections on cells which border on the channel. For some critical nodes those neighboring netlist connections will match the connections on the critical node thereby simplifying routing and reducing the costs of this channel relative to this critical node. For another critical node sharing no netlist connections with the neighbors of this channel the costs associated with placement in the channel would be high, because of additional routing time, area, and power consumption required to make the netlist connections.

"Cost" for the critical nodes might be derived from an easily calculated parameter such as area or netlist connections or more complex calculations such as power or timing requirements. In an embodiment of the invention critical nodes with the highest cost will be replaced first in the least expensive (in relative or absolute terms) of the available channels. In an alternate embodiment in which channel costs are calculated in relative terms, critical nodes will be give "first" access to those available channels which have the least cost relative to the critical node being replaced in the optimized design. By allocating according to cost, critical nodes and channels, the probability of design improvements is increased because available space is utilized in a manner likely to produce improvement in one or more of the user configured evaluation parameters, e.g. power, timing and area.

For purposes of visualization in FIG. 12A2, nodes 320A–322A are sorted by area cost only. This results in the layout optimization processes attempting first to place node 320A or its substitute 320B within any of the initial channels 1212–1216. As shown in FIG. 12C1, node 322B is the first of the two critical nodes associated with the critical cut 1 to be placed in the optimized layout. It has undergone a rotation and a mirroring operation in order to be placed within channel 1216. Next, a decompression process 1202 results in a final boundary 310B being formed. Twelve new channels, for each layer are defined from each of the five nodes as well as the upper and lower edges. Channel 1220 is shown. This channel is defined downward from the upper horizontal edge of the boundary 310B. After trying to fit node 320A/B within any of inexpensive, e.g. narrow channels and determining that neither it nor its alternate shape will fit, the node 320B is placed horizontally in channel 1220. The final solution 1 is shown in FIG. 12C1. The boundary 310B for solution 1 is smaller than the initial boundary 310A (see FIG. 10A). Thus a solution S(1) has been provided with an area smaller than that of the original user generated design. Other parameters for the solution may also be evaluated, e.g. power and timing.

FIGS. 12D1–2 and 12F1–2 show graphically the layout optimization processes initiated by cut 2 (see FIG. 11C). Cut 2 involves removing nodes 326A–328A from critical path 1052 and removing node 320A from critical path 1050 (see FIG. 10C). These critical nodes are sorted from most to least "costly" as is shown in FIG. 12D2. In FIG. 12D1, the remaining three nodes of the original layout, i.e. 322A–324A and 332A are shown in FIG. 12D1. A compression 1200 is performed on the original boundary 310A, subsequent to the removal of the critical nodes 320A, 326A, 328A associated with cut 2. This results in a new compressed boundary 1210A. Eight channels (per layer) are constructed within that boundary and none of them are sufficient to contain either of the nodes associated with a cut. For this reason, in FIG. 12E1, the decompression processes 1202 decompress the boundary 1210A to form boundary 1210B. Eight new channels (per layer) are defined within this box. Two of those channels, 1230–1232, are shown in FIGS. 12E1–E2. Channel 1230 is defined upwards from node 324A. Channel 1232A/B is defined upward from the bottom edge of the boundary 1210B. In FIG. 12E2, channel 1232A includes an "L" shaped subportion 1232B corresponding to underutilized or un-utilized layers of node 332A. In the example shown, node 332A has only one metal layer while all other nodes require two and three layers of metal routing (see Technology file 360B in FIG. 9A).

Into each of the eight channels the critical nodes 320A, 326A, 328A are placed in order of cost. In the example shown, area cost alone is being considered. Therefore, the node with the greatest area, 326A–328A, is given first access to the least expensive, e.g. narrowest, of the available channels. The first channel in which node 326A–328A can be placed is channel 1232A/B. The placement requires a rotation of the parent cell 326A and a substitution of child cell 330A for child cell 326A (see node file 360A in FIG. 9A). During the placement the solution generation processes 350P substituted the equivalent cell, i.e. cell 330A for cell 328A to allow maximum overlap with cell 332A, in the unutilized layers of that cell. Since the remaining cell, 320A, cannot fit within any of the existing channels, an expansion process, 1202, is again performed resulting in the final boundary 310C as shown in FIG. 12F1. New channel calculations are performed, producing ten channels (per layer) of which channel 1240 is referenced. Channel 1240 is defined from the top edge of the boundary 310C downward. A shape alternate, 320B for critical node/cell 320A is placed in the channel. This results in the solution 2 which includes all the parts of the original layout or their substitutes. The boundary 310C of solution 2 is smaller in area than the original layout boundary 310A (see FIG. 3). If, however, the user had weighted the target parameters e.g. power or timing more heavily than area, the area of the solutions generated by processes 350P might not be smaller than that of the initial solution, in this case the original layout S(0).

FIGS. 12G1–I1 show graphically the processes of layout optimization initiated with cut 5 (see FIG. 11C). Cut 5 involves the removal of cells 328A–326A, 320A–322A. All of which are shown in FIG. 12G2. The remaining cells, 324A–332A are contained within a boundary 1210A formed by compressing 1200 vertically the original layout boundary 310A. As shown in FIG. 12H1–2, six channels (per layer) are formed in the boundary of which channels 1250–1254 are referenced. Channel 1250A/B is defined upward from cell 332A. Channel 1252 is defined upward from bottom edge of boundary 1210B and channel 1254 is defined upward from cell 324A. Since none of the nodes associated with cut 5 can fit within any of the channels defined in the original boundary 1210A, decompression 1202 of the boundary is performed incrementally resulting in intermediate boundaries 1210B. The first of the nodes to be placed within a channel is the most costly of the nodes, e.g. in this case the one with the highest area cost, nodes 328A–326A. This is placed within the channel having the narrowest width, i.e. channel 1250A–B. In this embodiment of the invention channels are defined not only for the open spaces between parts but also for the under/unutilized portions of a specific cell. This availability determination is made by. the processes 350P utilizing the saturation file 364A (see FIG. 10B). In this case cell 332A lacks a second and third metal layer and additionally is underutilized at a device layer. This allows cell 326A and substitute sub-cell 330A to be placed into channels 1250A/B. Thus, cell 332A and cell 326A exist within the same perimeter because the two have complimentary availability among their respective layers. The next critical node, in order of cost, 1 is node 320A, which is placed within the narrowest, e.g. least expensive, available channel, e.g. channel 1252. In the remaining channel 1254 the substitute shape 322B for the original cell 322A is placed (see FIG. 9A). The placement requires both a rotation and a mirroring of the substitute cell 322B. Thus, solution 5 is shown in FIG. 12I1 within a boundary 310D which is smaller than the original layout's boundary 310A (see FIG. 3). Solution 5 includes cells 320A, 322B, 324A, 326A, 330A, and 332A.

Figure 12J:
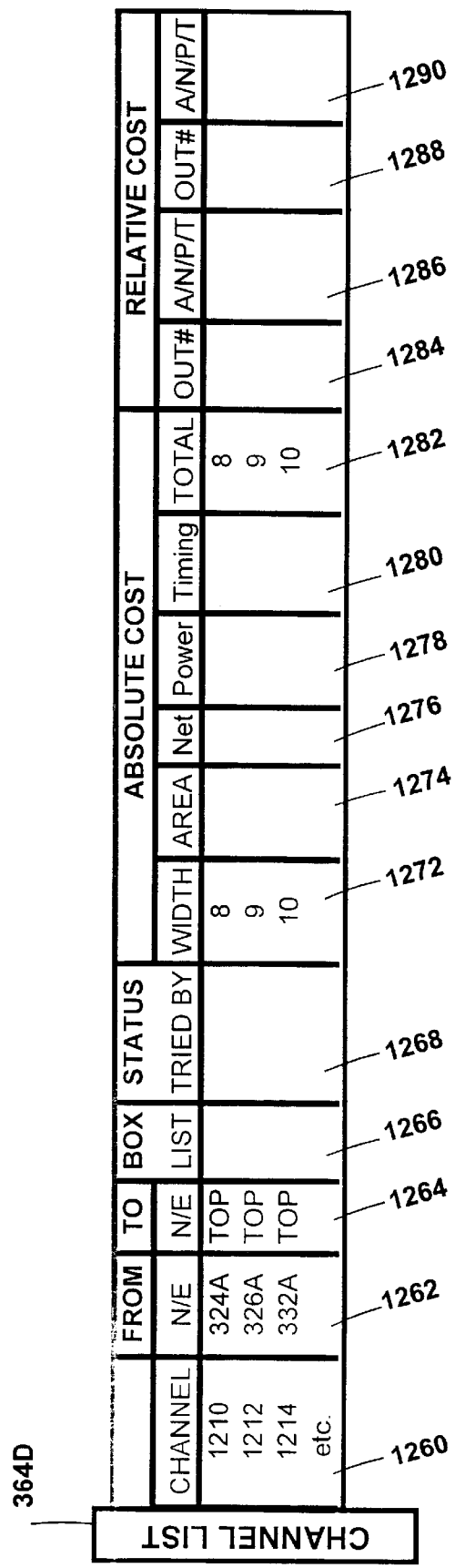
FIG. 12J shows run-time records for channels generated during the automatic layout optimization processes.

FIG. 12J shows an embodiment of the channel file 364D comprising channel records is shown. The file contains all channels within a given boundary. In an embodiment of the invention there would be separate channel records for each layer. The channel file is maintained by the solution generation processes 350P (see FIG. 3) to determine where to place critical nodes. The channel list contains a channel identifier field 1260, "from" and "to" fields 1262–1264, box list field 1266, status field 1268, absolute cost fields 1272–1282 and relative cost fields 1284–1290. The first field 1260 of the channel list 364D identifies which channel the individual row record corresponds to. Fields 1262–1264 indicate the cell or edge from which the channel is generated and the cell or edge at which the channel terminates. The channel may be subdivided into boxes and the box list field 1266 consists of a linked list of all boxes within a channel as well as the status of those boxes full or empty. The status field 1268 indicates the status of each of the boxes within a channel "tried" or "untried" and may additionally indicate by which critical node that box has been tried. When all the boxes of a channel are listed as "tried" and/or "full" then that channel is no longer utilized during the placement of any remaining critical nodes within the cell boundary. Channels in the original layout and channels created by the removal of nodes during the execution of a cut of a critical path are assigned a "cost," which correlates with the probability of a design improvement resulting from their use. Field 1272 provides for the calculation and storage of an absolute cost for the channel based on the channel width. Alternately, absolute channel cost could be established on the basis of the area of a channel or the size of the neighboring cells netlist, power or timing requirements (fields 1276–1280). Location of the channel, next to or away from the critical cut could also be used to establish absolute channel cost. Field 1282 would indicate the total absolute cost of a channel. In this embodiment critical nodes would be placed preferentially within lowest cost channels until those channels were found unsuitable or fully utilized. In the alternate embodiment, channels would be assigned relative cost which could be calculated before or during placement of an critical node in a channel. Relative cost fields 1284, 1288 could be used to keep track of the critical node identifier, while fields 1286, 1290 would list for that critical node any one or all of the following relative "cost" factors for that channel, e.g. area, net list, power and timing. For example, a channel would have a low cost in net list terms relative to a specific critical node if the nodes neighboring on a channel contained most of the net list connections which the critical node required. By these same criteria a channel would be high in cost relative to a specific critical node if the critical node's net list connections did not coincide with the net list connections on the nodes neighboring the specific channel. Thus, by assigning cost either absolute or relative to a specific channel the channel lists may be prioritized relative to the placement of critical nodes.

Figure 13:
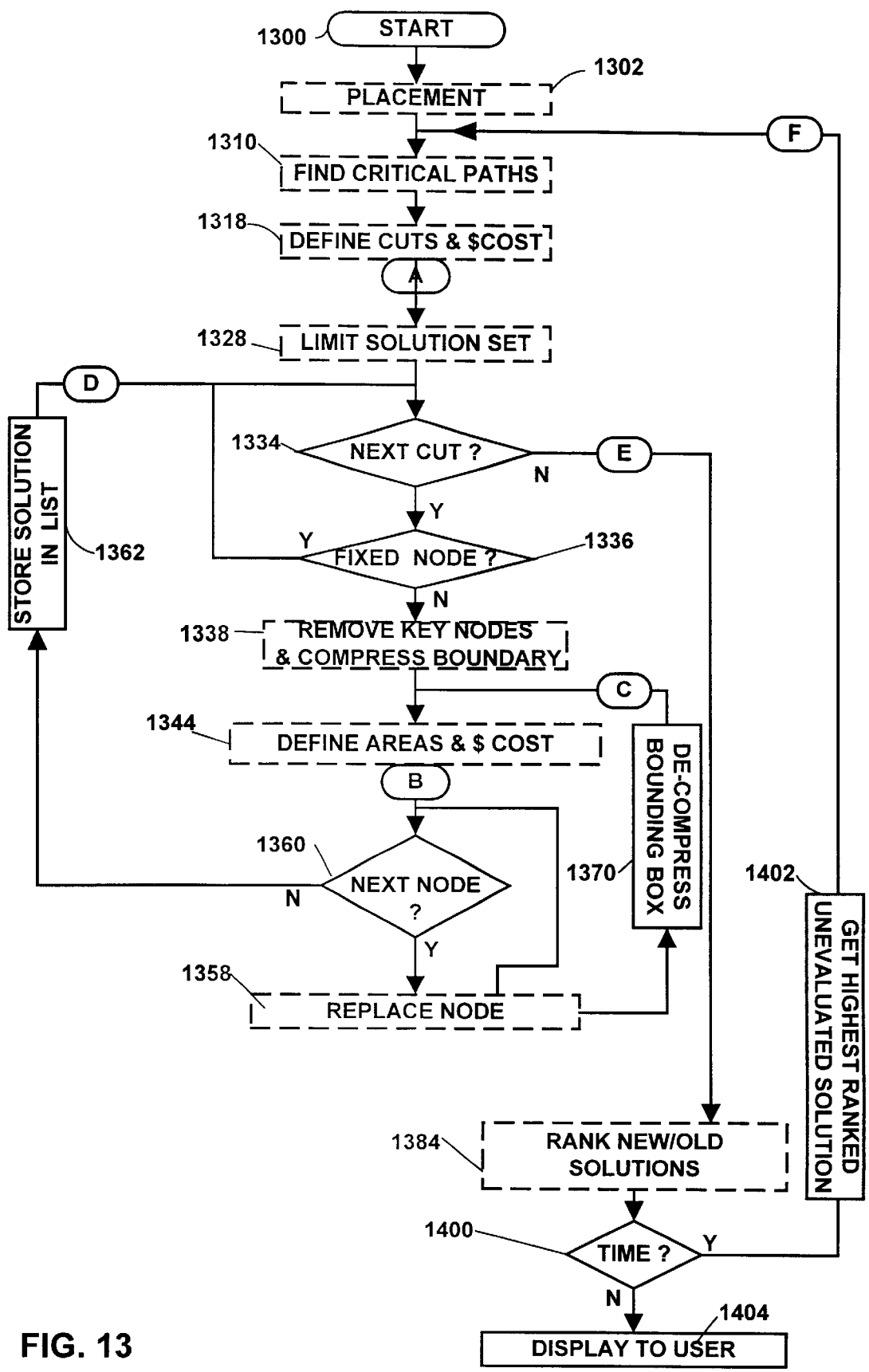
FIG. 13 is an overall process flow diagram detailing the automated design processes of the current invention.

FIG. 13 shows an overall view of the processes associated with the current invention for layout compaction and the generation of multiple design solutions to an initial design. FIGS. 14A–D show in greater detail the processes set forth in FIG. 13. Processing in FIG. 13 commences at start block 1300. Control passes to processes 1302. In processes 1302 the user defines an initial design in the form of a layout for the various components/subcomponents which make up the design. A microprocessor design for example could include a processor, a cache, a memory manager, buffers, and a timer. This layout provides the initial user generated solution, a.k.a. solution "0" or S(0). The solution including netlist and component layout is stored in a solution list the initial state of which is shown in FIG. 15A. Control is then passed to processes 1310.

In processes 1310 critical paths are determined for the first unevaluated solution in the solution list, in this case S(0). Critical paths, as is discussed above in connection with FIGS. 10–11, are those paths determined on a layer by layer basis and extending from component-to-component (or subcomponent) between opposing sides of the layout, in which no further compaction is possible. Once the critical paths in the solution are determined, control passes to processes 1318.

In processes 1318 key cuts through the critical paths are determined in a manner discussed above in connection with FIG. 11. Each key cut involves associated removal of one or more components, i.e. nodes from the initial layout. The cuts are then evaluated in terms of the cost associated with the removal of the nodes/components associated with each cut. The cost associated with the removal of one or more nodes/components may be derived from the calculation of one or more parameters associated with the components. In an embodiment of the invention the cost of a cut may be based on the number of netlist connections of the nodes/components associated with a cut. Thus, a cut which involves the removal of components with fifty netlist connections would be more costly than a cut which involved the removal of components with forty netlist connections. In another embodiment of the invention the cost of a cut may be derived from the calculation of several parameters; e.g.

power (P), timing (T) and area (A). These parameters may be assigned relative weights, including the user assigned relative weights discussed above in FIG. 7.

Control is then passed to processes 1328. In processes 1328 a determination is made as to how many of the key cuts generated in processes 1318 will be evaluated for the solution set. This determination is made based on parameters input by the user and discussed above in connection with FIG. 7. These include the total processing time 720, the number of solutions desired 722 (see FIG. 7). The limited set of cuts, i.e. "key" cuts forms an evaluation list. Control is then passed to decision process 1334.

Decision process 1334 begins a set of processes 133–1362 in which each key cut on the evaluation list is evaluated, and a solution derived from the cut is generated. Evaluation begins by removing the nodes/components associated with the cut, compressing the layout boundary and replacing the removed components through a combination of geometric rotations, shape alterations and component substitutions.

In decision process 1334 a determination is made as to whether another cut remains to be evaluated from those provided in the evaluation list. If that determination is in the affirmative, control passes to decision process 1336. In decision process 1336 a determination is made as to whether the node associated with the cut being evaluated is a fixed node (see FIG. 5–6). If the node is fixed control returns to decision process 1334 for the evaluation of the next cut. Alternately, in decision process 1336 if the cut being evaluation has associated nodes/components which are not fixed, i.e. are moveable, then control passes to decision processes 1338. In decision processes 1338 the key nodes associated with the cut are removed from the solution being evaluated and the boundary of that solution is compressed (see FIG. 12). Control then passes to processes 1344.

In processes 1344 available areas after boundary compression are defined. These areas, a.k.a. channels, are ranked in terms of a channel cost. In an embodiment of the invention the cost of a channel may be based on the number of netlist connections of the nodes/components associated with the channel. In another embodiment of the invention the cost of a channel may be derived from the calculation of several parameters; e.g. power (P), timing (T) and area (A) of the channel. These parameters may be assigned relative weights, including the user assigned relative weights discussed above in FIG. 7. Control then passes to decision process 1360.

In decision process 1360 a determination is made as to whether there remains a node/component/sub-component associated with the cut being evaluated which has not yet been replaced into the bounding box and coupled to its associated components. If that determination is in the affirmative i.e. that there are more nodes associated with the cut, then control passes to processes 1358. The next node/component associated with the cut being evaluated is replaced within the bounding box using any one of a number of geometric alterations, shape alterations or part substitutions. The order of node replacement may be chosen on the basis of cost, with for example, higher cost nodes being replaced first. Cost may be determined on the basis of a single parameter such as area, or a combination of parameters such as power, timing, and area. The parameters may be assigned relative weights. If a part is successfully replaced control returns to decision process 1360 until all the remaining components/sub-components associated with the cut have been replaced within the bounding box to form a new solution. If during the replacement of the node in processes 1358 a node cannot be replaced then control passes alternately to processes 1370 in which the bounding box itself is decompressed. Control subsequently passes to processes 1344 for redefinition of areas and cost associated with the new areas created by the decompression of the bounding box. The bounding box is decompressed until such time as the node can be placed within the bounding box.

If alternately in decision process 1360 a determination is made that no more nodes associated with the cut need to be replaced then control passes to processes 1362. In processes 1362 the new solution is added to the solution list and control subsequently returns to decision process 1334 for a determination as to whether any other cuts remain to be evaluated on the evaluation list. In the event a determination is reached that no more cuts remain on the evaluation list then control passes to processes 1384.

In processes 1384 new solutions on the solution list are evaluated with respect to existing solutions. The weights assigned by the user to the evaluation parameters, e.g. power, area and timing (see FIG. 7) may be used in performing this ranking. The solution list is then sorted so that the solutions which show the greatest improvement with respect to the initial solution, defined in processes 1302, are placed at the top of the list. Control then passes to decision process 1400. In decision process 1400 is made as to whether any of the processing time allocated by the user (see FIG. 7) remains. In the event that determination is in the affirmative control passes to process 1402. In process 1402 the highest ranked unevaluated solution (see FIG. 15B reference number 1552A) is obtained and presented to processes 1310 for determination of critical paths, etc. If alternately in decision process 1400 a determination is made that no time remains then control passes to process 1404. In process 1404 various graphical user interfaces (GUIs) are generated which display the generated solutions (see FIG. 15B) to the user in various forms. The solutions may be displayed comparatively as bar graphs using one or more parameters such as: power, timing and area. The solutions may be shown as netlists, or layouts (see FIG. 4). The GUIs allow the user to view and independently evaluate the solutions provided by the above-mentioned automatic layout and solution generation processes.

FIGS. 14A–D show the processes 350P (see FIG. 3) associated with providing one or more optimized design solutions from an initial layout in accordance with user specified target parameters. Processing begins at start block 1300 from which control is passed to placement subroutine 1302. The placement subroutine may be executed by a user or by existing electronic design tools which provide for rough layout of cells/sub-cells to form an initial solution S(0). The placement subroutine 1302 commences with process 1304. In process 1304 nodes and technology are defined in files similar to those described and discussed above in connection with FIG. 9A. Control is then passed to process 1306 in which an initial part layout is generated either by the user or by existing electronic design tools. The initial part layout is stored. Control is then passed to process 1308 in which a net list file 362A (see FIG. 9) is generated either by the user or by existing electronic design tools. Additionally the user defines constraints, e.g. hierarchical, topological, net, timing or group. These are stored in a file 362B described and discussed above in connection with FIG. 9B. With an initial layout thus defined control is passed to subroutine 1310.

In subroutine 1310 critical paths in the initial layout will be determined. Critical paths are paths which prevent further compaction of the layout (see FIG. 10A). There may be one or more critical paths in an initial layout. The critical path subroutine 1310 comprises processes 1312–1316. Processing begins with process 1312. In process 1312 vertical edges are drawn between all nodes in the initial layout. The bottom and top portions of the initial layout boundary are also considered to be respectively an origin and a terminus for an edge (see FIG. 10A). Information on each edge is stored in a saturation file 364A described and discussed above in FIG. 10B. Control is then passed to process 1314. In process 1314 the saturation of each edge is calculated. An edge links two nodes or a node and either the bottom or top of the layout boundary. Each edge is characterized by the extent to which sufficient routing space exists between the two nodes which are linked by the edge. An edge is said to be 100% or greater saturated when there is no additional room for further routing between the two nodes linked by an edge. In the embodiment shown, saturation is expressed as a percentage with percentages of 100 or greater indicating a lack of routing availability. The actual calculation involves using a global routing algorithm well known to those in the prior art to establish approximate space required for routing between the nodes. Once the required routing space is estimated, half the vertical dimension of each cell is added to determine the required edge length "D2." Vertical and horizontal are relative terms as used herein and are meant only to indicate a relationship between corresponding processes. The required spacing "D2" is compared with the actual vertical spacing of the two nodes, or node and edge, in the initial layout. The actual spacing is identified as "D1". The percent saturation is equal to the ratio of D2 divided by D1 expressed as a percentage. Subsequent to the calculation of a saturation value for each edge, the value is recorded in the saturation field 1020 of the saturation file 364A (see FIG. 10B). Control is then passed to process 1316. In process 1316 critical paths are extracted from the saturation file 364A. Those critical paths are described and discussed above in connection with FIG. 10C. A critical path is a path of linked edges extending from the bottom to the top of the initial layout boundary (see FIG. 10A). Subsequent to the determination of critical paths preventing compaction of the initial layout, control is passed to subroutine 1318.

In subroutine 1318 key nodes associated with each critical path are determined so as to allow compaction of the initial layout. Subroutine 1318 includes processes 1322–1326. Processing begins with process 1322 in which various combinations of nodes including at least one node from each critical path are determined. Those node combinations are placed in a list 364C (see FIG. 11B). Next in process 1324 a cost is calculated for each node combination. Cost can be calculated in any number of ways without departing from the teaching of this invention. For example, the cost of a cut may be set equal to the sum of the areas of each of the nodes associated with a cut. Alternately, the cost of a cut may be equal to some weighting of the area of each node associated with the cut as well as the number of connections, e.g. the net list, of each node in the cut. In still another embodiment cost may be calculated using node area, node connections and the power requirements of all the nodes associated with a cut. In still another embodiment, the cost of a cut may be calculated using the area of nodes associated with the cut, the number of connections of each node associated with a cut, the power requirements of each node associated with a cut and the timing requirements of each node associated with a cut. In an embodiment of the invention the cost $Cu( ) of a cut "n" is calculated using the evaluation parameters, e.g. power (P), timing (T) and area (A), and the relative importance assigned to them (P%+T%+A%)=100% by the user (see FIG. 7) in accordance with the following equation.

$$\$Cu(n) = P\%[Cu(n)P] + T\%[1/Cu(n)T] + A\%[Cu(n)A)] \quad \text{Equation 1}$$

In Equation 1, a cuts cost increases, when the size (A) and power requirements (P) associated with the component(s) to be removed increases. Conversely, a cuts cost increases in inverse proportion to the sustainable clock speed (T) of the component(s) associated with a cut. After the assignment of cost the cuts are sorted in order of increasing cost. Numerous other cost calculation algorithms can be utilized to rank the likelihood that each cut will produce an improved solution to the initial layout.

Subsequent to the determination of a cost for each cut control is passed to process 1326. In process 1326 the list of cuts 364C is sorted in order of ascending cost. Thus, the cuts at the top of the list will require the least processing time to evaluate since their cost expressed in terms of any one or all of: area, net list, power and timing requirements will be the least burdensome in terms of expected processing time to evaluate. Subsequent to the selection and ranking of key nodes associated with cuts through each of the critical paths, control is passed to subroutine 1328.

In subroutine 1328 the determination is made based on user inputs at user interface 702 (see FIG. 7) as to how many solutions can be generated within the processing time and considering of the complexity of the evaluation which the user has requested. The first of the processes associated with this subroutine is process 1330. In process 1330 the estimated number of solutions to present to the user is determined. This determination may be based on the entry in field 722 in which the user requested a specific number of solutions (see FIG. 7). Alternately in the event the user did not check a specific number of solutions in field 722 and instead indicated a processing time limitation then a determination will be made as the estimated number of solutions that could be generated in the allocated time. This calculation could take into account the constraints which the user requires to be evaluated during the optimization process. If more constraints need to be evaluated the number of solutions that can be produced in a given amount of time is reduced. See FIG. 7 above for discussion of the constraints 724–728 which the user can enable during the optimization process. After the number of solutions required by the user is determined, control is passed to process 1332. In process 1332 the first "N" entries from the cut list formed in process 1326 are removed and placed in a solution list. The number of entries N may correspond to the number of solutions required. This grouping is called an evaluation list. It is a subset of the entries on the cut list. Control is then passed to decision process 1334. In decision process 1334 a determination is made as to whether there is another cut to evaluate on the evaluation list. If this determination is in the negative, i.e. that all cuts on the evaluation list have been evaluated then control is passed to splice block E for the completion of the multiple solution processes. If there are still cuts left to evaluate in the evaluation list then control is passed to decision process 1336. In decision process 1336 a determination is made as to whether any of the nodes in the next cut being processed is a fixed node. Fixed in relation to the initial layout. Node 324A is a fixed node (see FIG. 3). In the event the cut selected contains such a fixed node, then control returns to process 1334 for the selection of the next cut, because the particular cut that was selected was an improper candidate for evaluation because it contained a node that could not be removed from the initial layout even though it lay in the critical path. If alternately, in decision process 1336 the determination is made that no node in the selected cut is fixed then control is passed to subroutine 1338. The first of the processes in the node removal subroutine 1338 is process 1340. In process 1340, all of the critical nodes associated with the cut are removed from the initial layout. These form an outsider list which is temporary in that it exists only while a single cut is being evaluated. It contains a record of those nodes which need to be placed back into the initial layout. Control is then passed to process 1342. In process 1342 a one dimensional vertical compression of the nodes remaining in the initial layout is performed. This process is shown in FIGS. 12A1, 12D1, 12G1 by compression 1200. This forms a new compressed layout boundary. Control is then passed to subroutine 1344.

In subroutine 1344 available areas for node placement are defined within the compressed layout boundary created in process 1342 above. The first of the processes associated with subroutine 1344 is process 1346. In process 1346 channels are created within the new layout boundary. Channels are constructed vertically above and below each node in the boundary as well as from the bottom and top of the boundary itself. This results in the creation of a channel list, of all the channels for or within this particular boundary (see FIG. 12J). Control is then passed to process 1348. In process 1348 each channel is subdivided into boxes and the dimension of each box including its width is stored in the channel list. Control is then passed to process 1350. In process 1350 a cost is calculated for each channel. Cost can be calculated in absolute terms by using for example the width of a channel. In an alternate embodiment, channel cost can be calculated in a relative fashion for each critical node in the outsider list determined above in process 1340. For example, a given channel might have a low cost relative to one node of a cut in that it placed that node in proximity to neighboring nodes with which routing is required. That same channel might have a high cost relative to another node of the cut in that the channel places that node both adjacent to neighbors with which there is no routing requirement and distant from nodes with which routing is required.

In an embodiment of the invention the cost $Ch( )$ of a channel "n" is calculated using the evaluation parameters, e.g. power (P), timing (T) and area (A), and the relative importance assigned to them (P%+T%+A%)=100% by the user (see FIG. 7) in accordance with the following equation.

$$\$Ch(n) = P\%[Ch(n)P] + T\%[1/Ch(n)T] + A\%[Ch(n)A)] \quad \text{Equation 2}$$

In the embodiment of the invention represented by Equation 2, a channels cost increases, when the size (A) of the channel increases or the power requirements (P) of the component(s) associated with the channel increases. Conversely, a channels cost increases in inverse proportion to the sustainable clock speed (T) of the component(s) associated with a channel. The components associated with the channel may be either the components which border the channel or the components to be placed in the channel. After the assignment of cost the channels are sorted in order of increasing cost. Once a cost for each channel is determined that information is added to the channel list. Control is then passed to decision process 1360.

In decision process 1360 a determination is made as to whether for the cut being processed another critical node exists on the outsider list which has not yet been placed within the boundary. If that determination is in the negative i.e. that their cut has been fully evaluated and that all critical nodes have been replaced within the boundary then control is passed to process 1362. In process 1362 the layout generated by the replacement of the critical nodes is stored as a solution in a solution list and then control is then passed to splice block D for the processing of the next cut (see FIG. 14B). Alternately, if in decision process 1360 a determination is made that as to this cut, not all critical nodes have been placed within the boundary then control is passed to subroutine 1358.

In subroutine 1358 the critical nodes are placed within the channels of the new layout boundary. The critical node replacement subroutine 1358 begins at decision process 1364. In process 1364 the next critical node is taken from the outsider list. In an embodiment of the invention, the outsider list may be sorted so as to prioritize the order of replacement of critical nodes into channels. In the embodiments shown in FIGS. 12A1–I1 the replacement of critical nodes was determined on the basis of the cost of each node. The cost of the critical node can be the result of a simple calculation involving area in which those critical nodes having a greater area are given first priority of reallocation within the boundary. Alternately, as will be obvious to those skilled in the art, the cost of an critical node can be determined by any one or all of the following in any combination including; area, net list, power or timing. Additionally, these parameters may be assigned relative weights for purposes of determining cost. Once the next critical node is determined in process 1364 control is passed to process 1366. In process 1366 a determination is made as to whether any available channels remain. A channel may accept multiple nodes provided that there have been enough boxes defined within the channel to accommodate the nodes. The channel is thus available while it still has boxes remaining. Once channel availability is determined control is passed to decision process 1368. In decision process 1368 a determination is made as to whether there are any available channels. In the event that determination is in the negative control is passed to process 1370. In process 1370 the boundary is expanded as shown by decompression 1202 shown in FIG. 12B1, FIG. 12E1 and FIG. 12H1. Control is then passed to splice block C for return to subroutine 1344 and the construction of new channels (see FIG. 14B). Alternately, if in decision process 1368 a determination is made that there are available channels, then control is passed to process 1372. In process 1372 the least costly of the available channels and the available box among the available boxes within that channel having the lowest cost, e.g. narrowest width is selected. Control is then passed to process 1374. In process 1374 the box within the channel selected in process 1372 is marked as "tried". Control is then passed to process 1376. In process 1376 the move required is evaluated. This may for example involve a determination as to whether placing the node within the channel will correspond to placing a node within an area defined in the initial layout as a "keep-out" area for the node (see FIG. 6 reference 624). Control is then passed to decision process 1378. In decision process 1378 determination is made as to whether a constraint e.g. "keep-in" or "keep-out" would be violated during the placement of this node. Other types of constraints including net list, timing, grouping etc. are possible (see FIG. 9B). In the event a constraint would be violated by the placement of this node within this box within this channel then control is returned to process 1366 for redetermination of available channels. Alternately if no constraint is violated in decision process 1378 then control is passed to decision process 1380. In decision process 1380 a determination is made as to whether the node or its alternate shapes or any rotation thereof or its substitute in any alternate shapes or substitutes thereof and any orientations of thereof including rotations and mirroring, fit within the box and channel selected in process 1372. If that determination is in the negative control returns to process 1366 for determination of available channels. Alternately if the node or its shape or equivalent or substitute fits within the selected box/channel then control is passed to process 1382. In process 1382 the critical node in its exact shape and/or equivalent is placed within the box within the channel and this information is stored. Control is then returned to decision process 1360 in which determination is made as to whether all critical nodes have been evaluated.

Figure 14A:
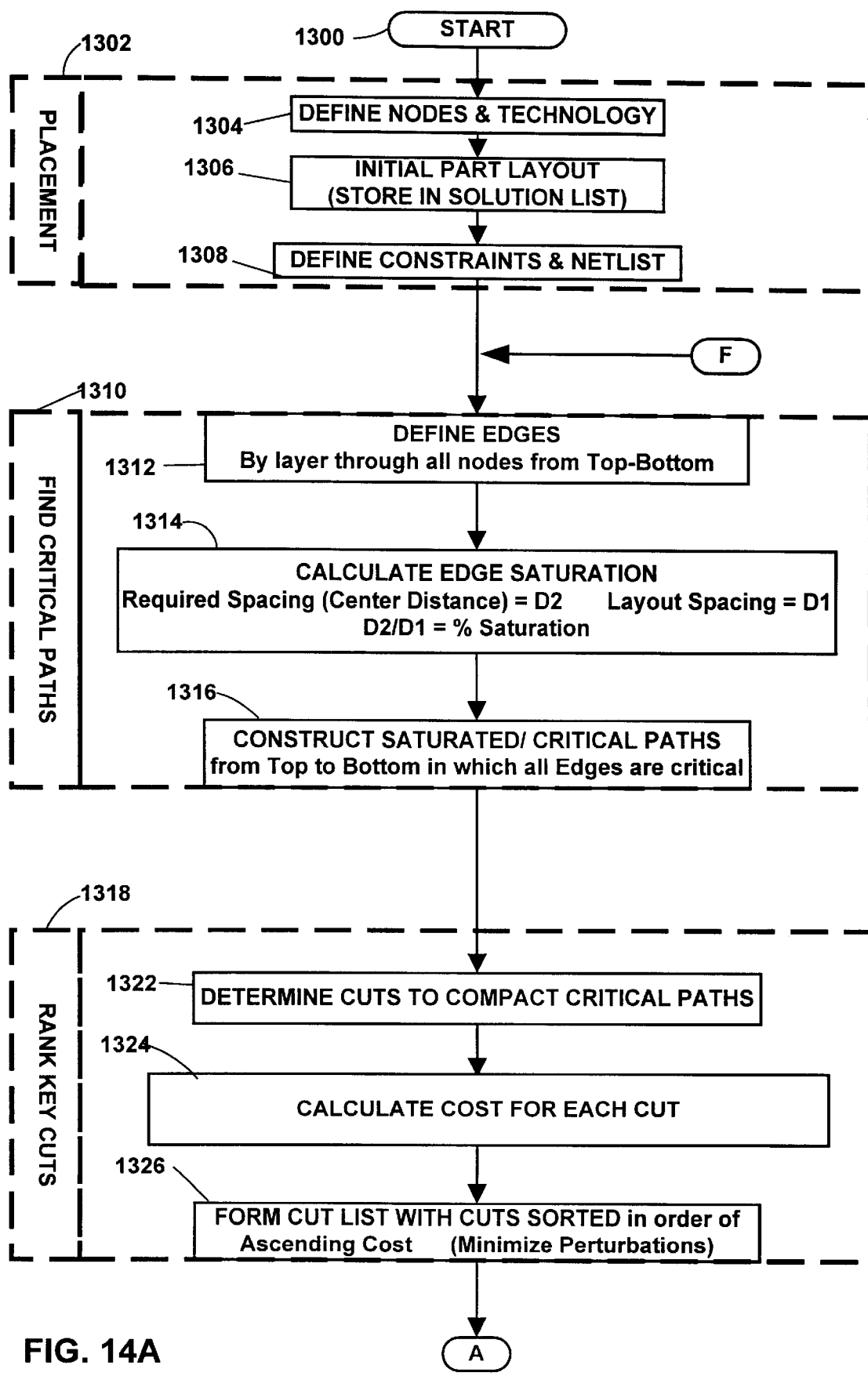
FIGS. 14A–D are detailed process flow diagrams of the processes set forth in FIG. 13.
Figure 14B:
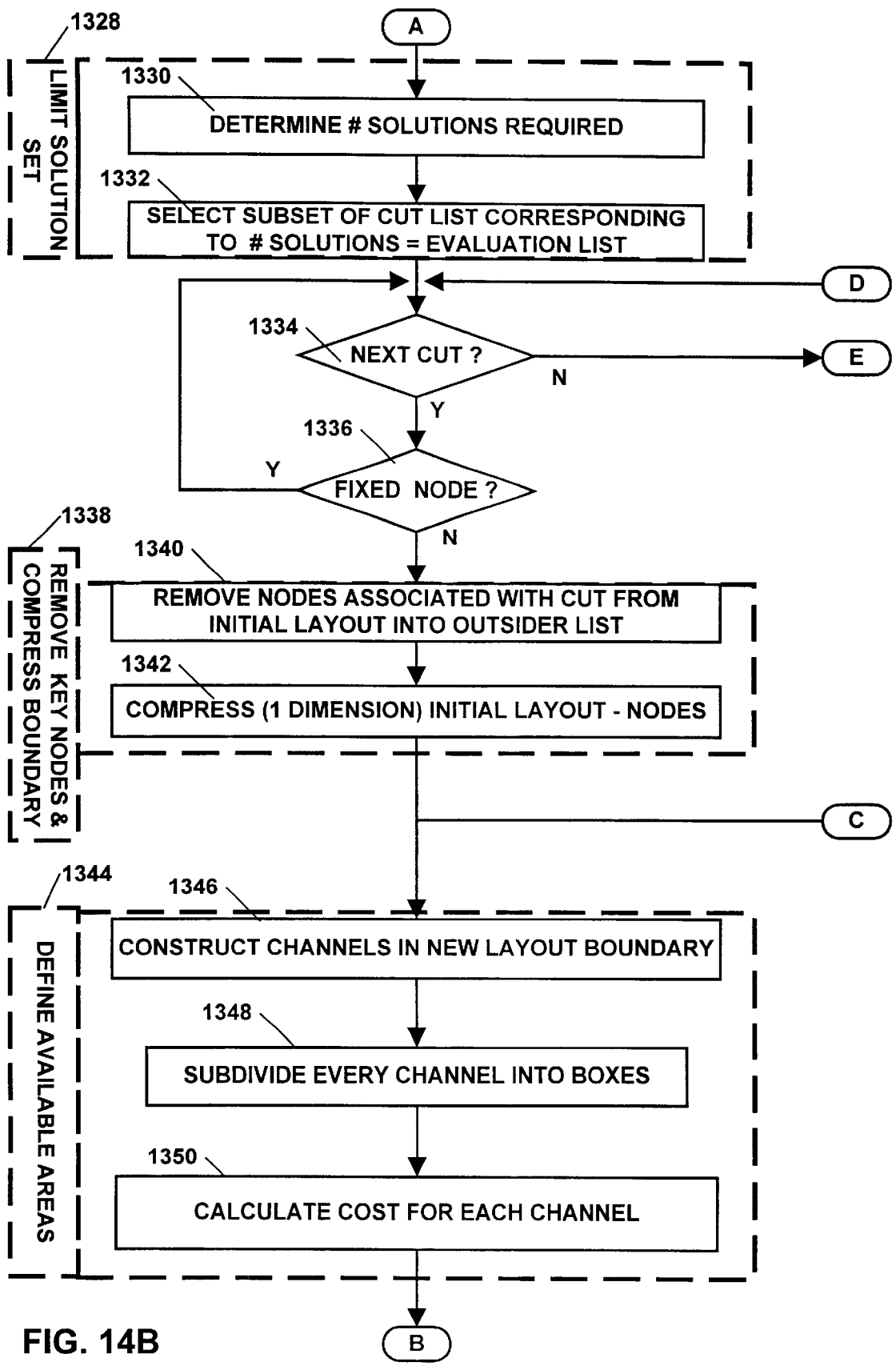
Figure 14C:
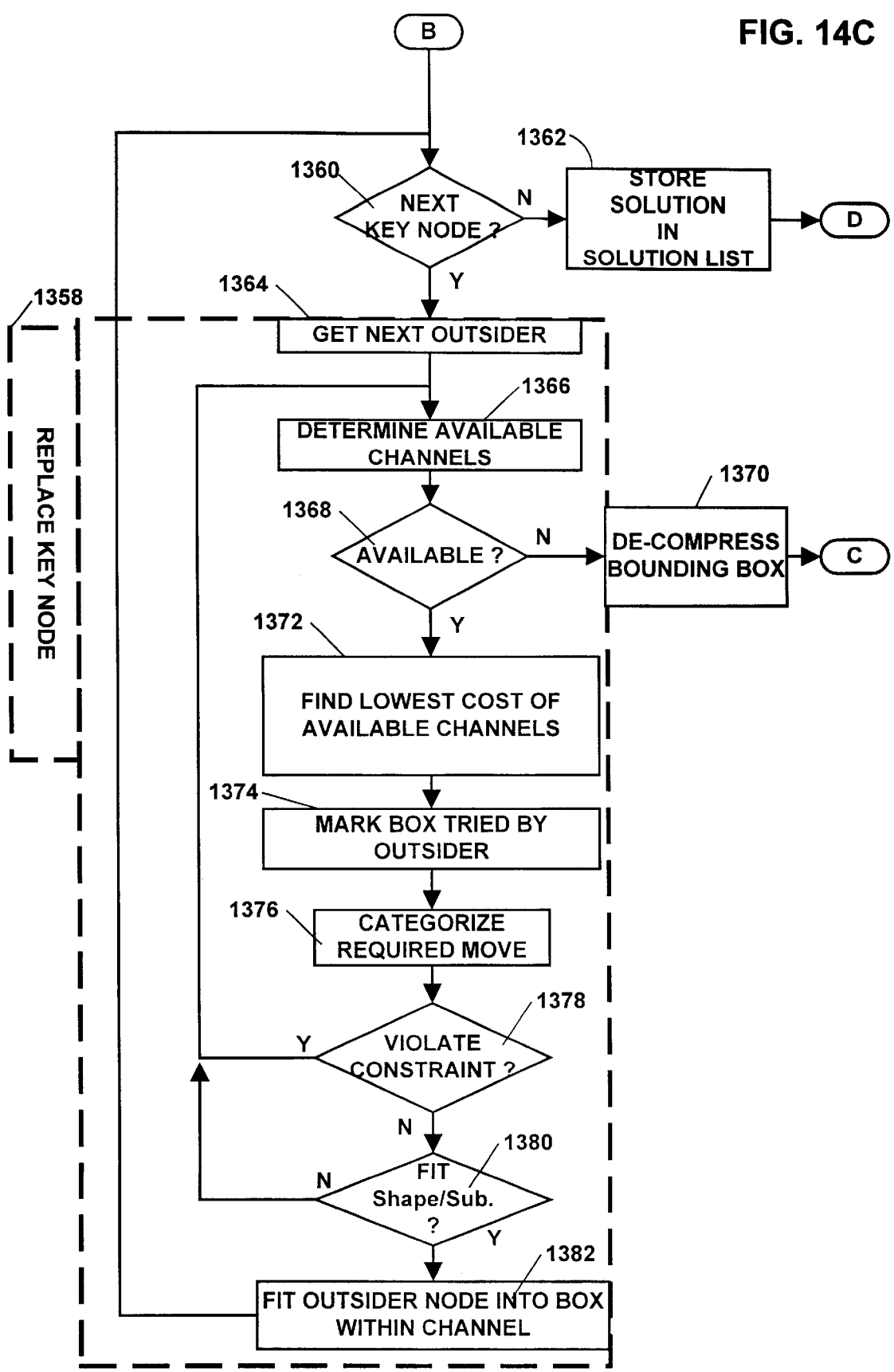
Figure 14D:
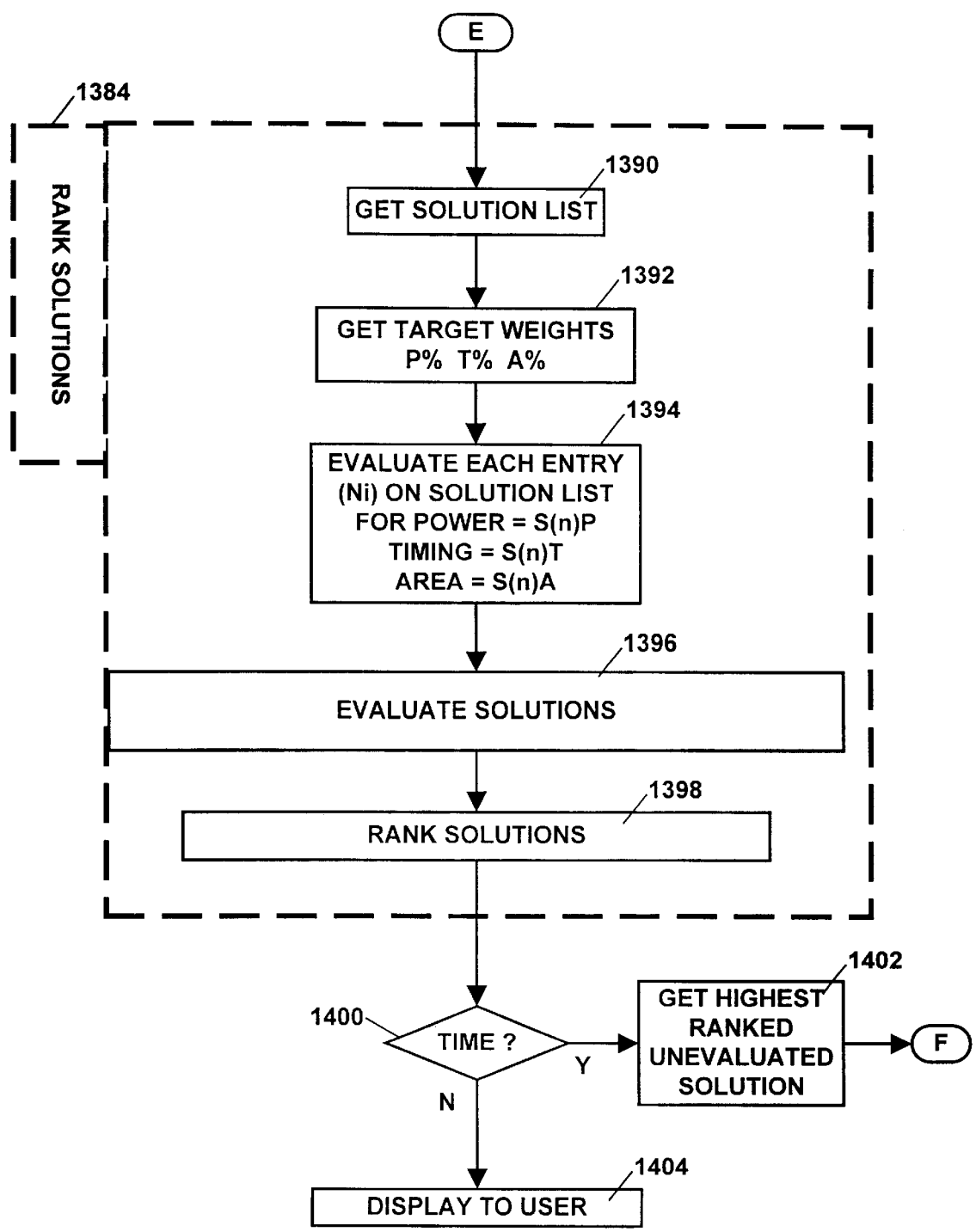

FIG. 14D shows the rank solution subroutine 1384 for processing one or more of the solutions stored in process 1362 (see FIG. 14C). The rank solution subroutine 1384 begins with splice block E (see decision process 1334 in FIG. 14B). This splice block is accessed once there are no more cuts to be evaluated. Processing begins with process 1390. In process 1390 the solution list (see FIG. 15) generated in process 1362 (see FIG. 14C) is retrieved. Control is then passed to process 1392. In process 1392 the target weights established by the user discussed above in both FIG. 7 and FIG. 9B is retrieved. From this the weights which the user has allocated to power, timing and area, for this particular set of solutions are retrieved. These variables P%, T%, and A% corresponding to the relative weights of power timing and area are stored. Control is then passed to process 1394. In process 1394 each entry/layout on the solution list is evaluated in terms of power, timing and area. Control is then passed to process 1396. In process 1396 a rank weight is given to each solution/entry on the solution list. In an embodiment of the invention the rank of a given solution is equal to the sum of the target weight times the ratio of the corresponding parameter for the solution/entry divided by the corresponding parameter for the initial layout. In an embodiment of the relative rank of a solution $S(n) relative to the initial solution $S(0) is calculated using the evaluation parameters, e.g. power (P), timing (T) and area (A), and the relative importance assigned to them (P%+T%+A%)=100% by the user (see FIG. 7) in accordance with the following equation.

$$\$S(n) = P\%[S(0)P/S(n)P] + T\%[S(n)T/S(0)T] + A\%[S(0)A/S(n)A)] \quad \text{Equation 3}$$

In the embodiment of the invention represented by Equation 3, the relative rank of a solution increases, when the size (A) or power requirements of the solution decrease relative to the initial solution. Conversely, a solutions value increases when the sustainable clock speed (T) of the solution increases relative to the initial solution. Each of these is summed to produce a relative ranking of the solution versus the original layout. Control is then passed to process 1398. In process 1398 the solutions are sorted in order of descending rank. This places solutions representing the greatest improvement according to the user defined target weights over the initial layout at the top of the list (see FIG. 15B). For example, if the user has set power and timing as having zero relevance and area as the only requirement, then the solutions at the top of the list will be solutions representing the greatest reduction in overall area as opposed to the original layout. Alternately if the user ranked power of being most importance and area and timing of little or no importance then the entries at the top of the sorted solution list would exhibit the greatest reduction in power consumption versus the original layout. Alternately if the user weights for timing greatly exceeded those for power or area then the solutions ranked at the top of the target solution list would exhibit the greatest improvement in timing, e.g. processing speed increases versus the original layout.

Control then passes to decision process 1400. In decision process 1400 is made as to whether any of the processing time allocated by the user (see FIG. 7) remains. In the event that determination is in the affirmative control passes to process 1402. In process 1402 the highest ranked unevaluated solution (see FIG. 15B reference number 1552A) is obtained and presented to processes 1310 for determination of critical paths, etc. If alternately in decision process 1400 a determination is made that no time remains, then control passes to process 1404. In process 1404 various graphical user interfaces (GUIs) are generated which display the generated solutions (see FIG. 15B) to the user in various forms. The solutions may be displayed comparatively as bar graphs using one or more parameters such as: power, timing and area. The solutions may be shown as netlists, or layouts (see FIG. 4). The GUIs allow the user to view and independently evaluate the solutions provided by the above-mentioned automatic layout and solution generation processes.

FIGS. 15A–B show the respectively an initial state of the solution list 1500A in FIG. 15A and a subsequent state of this solution list 1500B in FIG. 15B. In the initial state, the solution list 1500A contains a single entry 1550A for the user generated solution S(0) contained in solution field 1510. That entry has not yet been evaluated as indicated by the absence of entries in the power field 1512, the timing field 1514, the area field 1516, and the weighted total field 1518. Additionally, as is indicated by the "NO" entry in field 1520 no critical paths have been determined for that solution.

FIG. 15B shows the state of the solution set after the evaluation of the critical cuts selected for the evaluation list in processes 1310 for solution S(0). The solutions produced by the selected cuts are solutions S(1–5). Those solutions have been evaluated as indicated by the entries in the power, timing, area and weighted total fields, respectively 1512–1518. Additionally, the record 1550B for solution S(0) has its critical path field 1520 marked affirmatively "YES" since the critical paths for that solution have already been generated and evaluated. The remaining solutions S(1–5) including the referenced solutions records 1552A–1554A for respectively solutions S(1) and S(4) are marked "NO" indicating that these solutions have not themselves been evaluated for a critical paths and further compactions. If the user has allowed sufficient time, these solutions marked "NO" may be evaluated further, by generating critical cuts, etc.. In process 1402 shown in FIGS. 13 and 14D the highest ranked unevaluated solution will be, assuming time is available, presented to processes 1310 for a determination of critical paths. In the example shown in FIG. 15B, record 1552A marked with "NO" in the critical path field 1520 and having the highest rank among the unevaluated solutions will be the first to be presented to processes 1310 from which critical paths and eventually further solutions will be generated. These too will be integrated into an expanded solution list and ranked in the manner discussed above.

Each solution is assigned a weighted rank which in the example shown is relative to the initial solution set S(0) which has a weighted total of 1.00. As discussed above various parameters can be used for ranking solutions. In the example shown these are power, timing and area. Solution S(1) referenced as record 1552A, has a weight of 1.11 indicating that it affords an improvement over the original solution S(0). Solution S(4) referenced as record 1554A, has a weight of 0.99 indicating that it affords no improvement over the original solution S(0). The GUI displays of processes 1404 (see FIG. 14D) will use the solution list and parameters contained therein to allow the user to compare the solutions generated by the above mentioned processes.

The foregoing description of embodiments of the present invention has been presented for purposes of illustration and description only. It is not intended to be exhaustive or to limit the invention to be forms disclosed. Obviously, many modifications and variations will be apparent to practitioners skilled in the art.

What is claimed is:

1. A method for generating multiple new solutions to an initial layout of cells, comprising the steps of:
   identifying a set of critical paths in said initial layout, each critical path includes adjacent cells which are too close together;
   identifying a set of critical cuts, each critical cut severing each of said critical paths; and
   creating said new solutions, each new solution corresponds to one of said critical cuts, each new solution is created by removing and replacing at least one cell from each critical path based on said corresponding critical cut, each new solution provides a new layout of cells and differs from said initial layout in relative placement of cells.

2. The method of claim 1, further comprising the step of:
   ranking said new solutions according to user defined relative weights for target parameters.

3. The method of claim 2, wherein:
   said target parameters include power, timing and area.

4. The method of claim 2, further comprising the steps of:
   determining a highest ranked new solution according to said set of relative weights; and
   creating additional solutions based on said highest ranked new solution.

5. The method of claim 4, wherein said step of creating additional solutions includes the steps of:
   identifying critical paths in said highest ranked new solution;
   identifying a set of critical cuts in said highest ranked new solution; and
   determining said additional solutions, each additional solution corresponds to a critical cut in said highest ranked new solution, each additional solution is created by removing and replacing cells in said highest ranked new solution.

6. The method of claim 2, further comprising the step of:
   reporting said ranking of said new solutions.

7. The method of claim 1, further comprising the step of:
   graphically displaying said new solutions.

8. The method of claim 1, wherein said removing and replacing of cells in said step of creating new solutions includes the steps of:
   removing a first set of cells;
   compressing said initial layout;
   constructing channels in said compressed initial layout; and
   fitting variants of said first set of cells into said channels.

9. A method according to claim 8, wherein:
   said variants of said first set of cells includes different sized versions of said first set of cells, different shaped versions of said first set of cells and different oriented versions of said first set of cells.

10. The method of claim 1, wherein said step of identifying a set of critical paths includes the steps of:
    forming paths extending from a bottom edge to a top edge, said paths intersecting cells of said initial layout, said paths each including line segments linking a lower cell to an upper cell;
    determining which line segments are saturated; and
    determining which of said paths are critical paths, each critical path contains line segments which are saturated on at least one routing layer.

11. The method of claim 1, wherein:
    said step of identifying a set of critical cuts includes ranking said critical cuts; and
    said step of creating new solutions includes selecting a subset of said critical cuts based on said ranking, said new solutions correspond to said subset of said critical cuts.

12. The method of claim 1, wherein:
    adjacent cells are too close together if routing cannot take place.

13. The method of claim 1, further comprising the step of:
    determining whether adjacent cells are too close together, including comparing a required spacing between a layer of adjacent cells to a spacing between said adjacent cells in said initial layout.

14. One or more processor readable storage devices for storing processor readable code, said processor readable code for programming one or more processors to perform a method for generating multiple new solutions to an initial layout of cells, the method comprising the steps of:
    identifying critical paths in said initial layout, each critical path includes adjacent cells which are too close together;
    identifying a set of critical cuts, each critical cut severing each of said critical paths; and
    creating said new solutions, each new solution corresponds to one of said critical cuts, each new solution is created by removing and replacing at least one cell from each critical path based on said corresponding critical cut, each new solution provides a new layout of cells and differs from said initial layout in relative placement of cells.

15. The computer readable program code means of claim 14, further comprising:
    computer readable program code means for ranking the solutions in the solution list.

16. The computer readable program code means of claim 15, wherein the ranking of the solutions is determined on the basis of at least one of the following group of evaluation parameters consisting of: power, timing and area.

17. One or more processor readable storage devices according to claim 15, wherein said method further comprising the steps of:
    determining a highest ranked new solution according to said set of relative weights; and
    creating additional solutions based on said highest ranked new solution.

18. One or more processor readable storage devices according to claim 17, wherein said step of creating additional solutions includes the steps of:
    identifying critical paths in said highest ranked new solution;
    identifying a set of critical cuts in said highest ranked new solution; and
    determining said additional solutions, each additional solution corresponds to a critical cut in said highest ranked new solution, each additional solution is created by removing and replacing cells in said highest ranked new solution.

19. One or more processor readable storage devices according to claim 14, wherein said removing and replacing of cells in said step of creating new solutions includes the steps of:

removing a first set of cells;

compressing said initial layout;

constructing channels in said compressed initial layout; and fitting variants of said first set of cells into said channels.

20. One or more processor readable storage devices according to claim 14, wherein step of identifying critical paths includes the step of:

forming paths extending from a bottom edge to a top edge, said paths intersecting cells of said initial layout, said paths each including line segments linking a lower cell to an upper cell;

determining which line segments are saturated; and determining which of said paths are critical paths, each critical path contains line segments which are saturated on at least one routing layer.

21. One or more processor readable storage devices according to claim 14, wherein:

said step of identifying a set of critical cuts includes ranking said critical cuts; and said step of creating new solutions includes selecting a subset of said critical cuts based on said ranking, said new solutions correspond to said subset of said critical cuts.

22. An apparatus used for generating multiple new solutions to an initial layout of cells, comprising:

an interface;

a storage device; and a processor in communication with said interface and said storage device, said process performs a method comprising the steps of:

identifying critical paths in said initial layout, each critical path includes adjacent cells which are too close together, identifying a set of critical cuts, each critical cut severing each of said critical paths, and creating said new solutions, each new solution corresponds to one of said critical cuts, each new solution is created by removing and replacing at least one cell from each critical path based on said corresponding critical cut, each new solution provides a new layout of cells and differs from said initial layout in relative placement of cells.

23. An apparatus according to claim 22, wherein said method further comprises the steps of:

ranking said new solutions according to user defined relative weights for target parameters;

determining a highest ranked new solution according to said set of relative weights; and creating additional solutions based on said highest ranked view solution.

24. An apparatus according to claim 22, wherein said step of creating additional solutions includes the steps of:

identifying critical paths in said highest ranked new solution;

identifying a set of critical cuts in said highest ranked new solution; and determining said additional solutions, each additional solution corresponds to a critical cut in said highest ranked new solution, each additional solution is created by removing and replacing cells critical paths in said highest ranked new solution.

25. An apparatus according to claim 22, wherein said removing and replacing of cells in said step of creating new solutions includes the steps of:

removing a first set of cells;

compressing said initial layout;

constructing channels in said compressed initial layout; and fitting variants of said first set of cells into said channels.

26. A method for generating multiple new solutions to an initial layout of cells, each new solution provides a new layout of cells and differs from said initial layout in relative placement of cells, said method comprising the steps of:

receiving a set of relative weights for target parameters;

creating a first set of new solutions, each new solution in said first set is created by removing and replacing cells from said initial layout;

ranking said first set of new solutions according to said set of relative weights;

determining a highest ranked solution from said first set of new solutions; and creating a second set of new solutions each new solution in said second set is created by removing and replacing cells from said highest ranked solution from said first set of new solutions.

27. A method according to claim 26, further comprising the steps of:

ranking said second set of new solutions according to said set of relative weights; and reporting said ranking of said second set of new solutions.

28. A method according to claim 26, wherein:

said target parameters include power, timing, and area.

29. One or more processor readable storage devices for storing processor readable code, said processor readable code for programming one or more processors to perform a method for generating multiple new solutions to an initial layout of cells, each new solution provides a new layout of cells and differs from said initial layout in relative placement of cells, said method comprising the steps of:

receiving a set of relative weights for target parameters;

creating a first set of new solutions, each new solution in said first set is created by removing and replacing cells from said initial layout;

ranking said first set of new solutions according to said set of relative weights;

determining a highest ranked solution from said first set of new solutions; and creating a second set of new solutions, each new solution in said second set is created by removing and replacing cells from said highest ranked solution from said first set of new solutions.

30. One or more processor readable storage devices according to claim 29, wherein said method further comprises the steps of:

ranking said second set of new solutions according to said set of relative weights; and reporting said ranking of said second set of new solutions.

31. One or more processor readable storage devices according to claim 29, wherein:

said target parameters include power, timing, and area.

* * * * *

UNITED STATES PATENT AND TRADEMARK OFFICE
CERTIFICATE OF CORRECTION

PATENT NO. : 6,449,761 B1
DATED : September 10, 2002
INVENTOR(S) : Greidinger

It is certified that error appears in the above-identified patent and that said Letters Patent is hereby corrected as shown below:

Column 28,
Line 43, delete current text and replace with -- One or more processor readable storage devices according to claim 14, wherein said method further comprises the step of: ranking said new solutions according to user defined relative weights for target parameters. --

Column 29,
Line 59, delete "view" and replace with -- new --
Line 60, after "claim", before "wherein" replace "22" with -- 23 --.

Signed and Sealed this

Fourth Day of January, 2005

JON W. DUDAS
*Director of the United States Patent and Trademark Office*